US008427458B2

(12) United States Patent
Tanikame et al.

(10) Patent No.: US 8,427,458 B2
(45) Date of Patent: Apr. 23, 2013

(54) SCAN DRIVING CIRCUIT AND DISPLAY DEVICE INCLUDING THE SAME

(75) Inventors: Takao Tanikame, Kanagawa (JP); Seiichiro Jinta, Aichi (JP)

(73) Assignee: Sony Corporation, Tokyo (JP)

( * ) Notice: Subject to any disclaimer, the term of this patent is extended or adjusted under 35 U.S.C. 154(b) by 978 days.

(21) Appl. No.: 12/457,756

(22) Filed: Jun. 19, 2009

(65) Prior Publication Data

US 2010/0007649 A1 Jan. 14, 2010

(30) Foreign Application Priority Data

Jul. 14, 2008 (JP) ................................ 2008-182369

(51) Int. Cl.
*G06F 3/038* (2006.01)
*G09G 3/30* (2006.01)
*G11C 19/00* (2006.01)

(52) U.S. Cl.
USPC ................................ 345/204; 345/76; 377/64

(58) Field of Classification Search .............. 345/76–84, 345/98–100, 204, 213, 690; 377/64–81
See application file for complete search history.

(56) References Cited

U.S. PATENT DOCUMENTS

| | | | | |
|---|---|---|---|---|
| 6,670,943 | B1 * | 12/2003 | Ishii et al. | 345/100 |
| 7,224,341 | B2 * | 5/2007 | Ishii et al. | 345/100 |
| 7,812,787 | B2 * | 10/2010 | Eom | 345/45 |
| 8,035,581 | B2 * | 10/2011 | Choi | 345/76 |
| 8,063,875 | B2 * | 11/2011 | Ishii | 345/103 |
| 8,125,422 | B2 * | 2/2012 | Choi | 345/82 |
| 2005/0017934 | A1 | 1/2005 | Chung et al. | |
| 2007/0124633 | A1 * | 5/2007 | Kim | 714/726 |
| 2008/0246698 | A1 * | 10/2008 | Eom | 345/76 |
| 2008/0252622 | A1 * | 10/2008 | Tai et al. | 345/204 |
| 2009/0195561 | A1 * | 8/2009 | Iisaka et al. | 345/690 |
| 2009/0303169 | A1 * | 12/2009 | Tanikame et al. | 345/100 |

FOREIGN PATENT DOCUMENTS

| | | | |
|---|---|---|---|
| JP | 2005-031630 | | 2/2005 |
| JP | 2006-309217 | A | 11/2006 |
| JP | 2007-101900 | A | 4/2007 |
| JP | 2008-257159 | A | 10/2008 |
| JP | 2009-294510 | A | 12/2009 |

OTHER PUBLICATIONS

Japanese Office Action issued Jul. 20, 2010 for corresponding Japanese Application No. 2008-182369.

* cited by examiner

*Primary Examiner* — Rodney Amadiz

(74) *Attorney, Agent, or Firm* — Rader, Fishman & Grauer PLLC

(57) ABSTRACT

A scan driving circuit includes a shift register unit and a logic circuit unit. The start of a start pulse of an output signal $ST_{p+1}$ of a p+1'th shift register is situated between the start and end of a start pulse of the output signal $ST_p$ of a p'th shift register, and one each of a first enable signal through a Q'th enable signal exist in sequence between the start of the start pulse of the output signal $ST_p$ and the start of the start pulse of the output signal $ST_{p+1}$. The operations of a (p', q)'th NAND circuit are restricted based on period identifying signals, such that the NAND circuit generates scanning signals based only on a portion of the output signal STP corresponding to the first start pulse, the signal obtained by inverting the output signal $ST_{p+1}$, and the q'th enable signal $EN_q$.

10 Claims, 28 Drawing Sheets

[TP(1)-2]

[TP(1)-1]

[TP(1)0]

[TP(1)1]

[TP(1)2]

[TP(1)3]

[TP(1)4]

[TP(1)5]

SCAN DRIVING CIRCUIT AND DISPLAY DEVICE INCLUDING THE SAME

BACKGROUND OF THE INVENTION

1. Field of the Invention

The present invention relates to a scan driving circuit and to a display device including the scan driving circuit. More particularly, the present invention relates to a scan driving circuit and to a display device including the scan driving circuit, in which signals can be supplied to scanning lines, initialization control lines, and display control lines, and a lit/unlit state of display elements can be switched multiple times during one field period by supplying multiple pulse signals to the display control lines during the field period, without affecting the signals being supplied to the scanning lines and initialization control lines.

2. Description of the Related Art

Examples of widely used display devices having display elements arranged in the form of a two-dimensional matrix include liquid crystal display devices made up of liquid crystal cells driven by voltage, and also display devices including light emitting units which emit light under application of electric current (e.g., organic electroluminescence light emitting units) and driving circuits for driving the light emitting units.

The luminance of display elements including light emitting units which emit light under application of electric current is controlled by the value of the current flowing through the light emitting units. In the same way as with liquid crystal display devices, such display devices having these display elements (e.g., organic electroluminescence display devices) can be driven by the simple matrix method and the active matrix method. While the active matrix method has shortcomings such as greater complexity in structure as compared with the simple matrix method, there are also various advantages, such as being capable of higher luminance.

Various types of driving circuits configured from transistors and capacitance units are in widespread use as circuits for driving a light emitting unit by the active matrix method. For example, Japanese Unexamined Patent Application Publication No. 2005-31630 discloses a display element configured of an organic electroluminescence light emitting unit and a driving circuit, and a driving method thereof. This driving circuit is a driving circuit configured of six transistors and one capacitance unit (hereinafter referred to as "6Tr/1C driving circuit"). FIG. 26 illustrates an equivalent circuit to a driving circuit (6Tr/1C driving circuit) of a display element of the m'th row and n'th column in a display device configured of display elements arrayed in the form of a two-dimensional matrix. Note that in the description, the display elements are assumed to be scanned in line sequence.

The 6Tr/1C driving circuit has a write transistor $TR_W$, a driving transistor $TR_D$, a capacitance unit $C_1$, and also a first transistor $TR_1$, a second transistor $TR_2$, a third transistor $TR_3$, and a fourth transistor $TR_4$.

At the write transistor $TR_W$, one source/drain region is connected to a data line $DTL_n$, and the gate electrode is connected to a scanning line $SCL_m$. At the driving transistor $TR_D$, one source/drain region is connected to the other source/drain region of the write transistor $TR_W$, thereby configuring a first node $ND_1$. One end of the capacitance unit $C_1$ is connected to a power supply line $PS_1$. At the capacitance unit $C_1$, a predetermined reference voltage (later-described voltage $V_{CC}$ in the example shown in FIG. 26) is applied to one end, and the other end is connected to the gate electrode of the driving transistor $TR_D$, thereby configuring a second node $ND_2$. The scanning line $SCL_m$ is connected to an unshown scanning circuit, and the data line $DTL_n$ is connected to a signal output circuit 100.

At the first transistor $TR_1$, one source/drain region is connected to the second node $ND_2$, and the other source/drain region is connected to the other source/drain region of the driving transistor $TR_D$. The first transistor $TR_1$ makes up a switch circuit portion connected between the second node $ND_2$ and the other source/drain region of the driving transistor $TR_D$.

At the second transistor $TR_2$, one source/drain region is connected to a power supply line $PS_3$ to which is applied a predetermined initializing voltage $V_{Ini}$ (e.g., −4 volts) for initialization of the potential of the second node $ND_2$, and the other source/drain region is connected to the second node $ND_2$. The second transistor $TR_2$ makes $TR_1$ makes up a switch circuit portion connected between the second node $ND_2$ and the power supply line $PS_3$ to which is applied the predetermined initializing voltage $V_{Ini}$.

At the third transistor $TR_3$, one source/drain region is connected to a power supply line $PS_1$ to which is applied a predetermined driving voltage $V_{CC}$ (e.g., 10 volts), and the other source/drain region is connected to the first node $ND_1$. The third transistor $TR_3$ makes up a switch circuit portion connected between the first node $ND_1$ and the power supply line $PS_1$ to which is applied the predetermined driving voltage $V_{CC}$.

At the fourth transistor $TR_4$, one source/drain region is connected to the other source/drain region of the driving transistor $TR_D$, and the other source/drain region is connected to one end of a light emitting unit ELP (more specifically, the anode electrode of the light emitting unit ELP). The fourth transistor $TR_4$ makes up a switch circuit portion connected between the other source/drain region of the driving transistor $TR_D$ and one end of the light emitting unit ELP.

The gate electrode of the write transistor $TR_W$ and the gate electrode of the first transistor $TR_1$ are connected to the scanning line $SCL_m$. The gate electrode of the second transistor $TR_2$ is connected to an initialization control line $AZ_m$. Scanning signal supplied to an unshown scanning line $SCL_{m-1}$ scanned immediately prior to the scanning line $SCL_m$ is also supplied to the initialization control line $AZ_m$. The gate electrodes of the third transistor $TR_3$ and the fourth transistor $TR_4$ are connected to a display control line $CL_m$ for controlling the lit/unlit state of the display element.

For example, each transistor is formed as a p-channel thin-film transistor (TFT), with the light emitting unit ELP provided on an interlayer-insulating later or the like, formed so as to cover the driving circuit. At the light emitting unit ELP, the anode electrode is connected to the other source/drain region of the fourth transistor $TR_4$, and the cathode electrode is connected to a power supply line $PS_2$. Voltage $V_{Cat}$ (e.g., −10 volts) is applied to the cathode electrode of the light emitting unit ELP. Symbol $C_{EL}$ represents the capacitance of the light emitting unit ELP.

Now, when configuring transistors of TFTs, irregularity in threshold voltage is unavoidable to a certain extent. In the event that there is irregularity in the amount of current flowing through the light emitting unit ELP due to irregularity in the threshold value of the driving transistor $TR_D$, the uniformity of luminance of the display device suffers. Accordingly, an arrangement has to be made where the amount of current flowing through the light emitting unit ELP is not affected by irregularity in the threshold value of the driving transistor $TR_D$. As described later, the light emitting unit ELP is driven so as to be unaffected by irregularity in the threshold value of the driving transistor $TR_D$.

A driving method of a display element at the m'th row and n'th column of a display device configured as a two-dimensional array of N×M display elements will be described with reference to FIGS. 27A and 27B. FIG. 27A illustrates a schematic timing chart of signals on the initialization control line $AZ_m$, scanning line $SCL_m$, and display control line $CL_m$. FIGS. 27B through 28B schematically illustrate the on/off states and the likes of the transistors of a 6Tr/1C driving circuit. To facilitate description, we will refer the period during which the initialization control line $AZ_m$ is scanned as the "m−1'th horizontal scan period", and the period during which the scanning line $SCL_m$ is scanned as the "m'th horizontal scan period".

As shown in FIG. 27A, in the m−1'th horizontal scan period, an initialization process is carried out, which will be described in detail with reference to FIG. 27B. In the m−1'th horizontal scan period, the initialization control line $AZ_m$ goes from a high level to a low level, and the display control line $CL_m$ goes from a low level to a high level. Note that the scanning line $SCL_m$ remains at the high level. Accordingly, during the m−1'th horizontal scan period, the write transistor $TR_W$, first transistor $TR_1$, third transistor $TR_3$, and fourth transistor $TR_4$ are in an off state, while the second transistor $TR_2$ is in an on state.

A predetermined initialization voltage $V_{Ini}$ for initializing the potential of the second node $ND_2$ is applied to the second node $ND_2$ via the second transistor $TR_2$ which is in the on state. Accordingly, the potential of the second node $ND_2$ is initialized.

Next, as shown in FIG. 27A, a video signal $V_{Sig}$ is written in the m'th horizontal scanning period. At this time, threshold voltage canceling processing of the driving transistor $TR_D$ is performed in conjunction. Specifically, the second node $ND_2$ and the other source/drain region of the driving transistor $TR_D$ are electrically connected, the video signal $V_{Sig}$ is applied from the data line $DTL_n$ to the first node $ND_1$ via the write transistor $TR_W$ which has been placed in an on state due to the signal from the scanning line $SCL_m$, thereby changing the potential of the second node $ND_2$ toward a potential which can be calculated by subtracting the threshold voltage $V_{th}$ of the driving transistor $TR_D$ from the video signal $V_{Sig}$.

More detailed description will be made with reference to FIGS. 27A and 28A. In the m'th horizontal scanning period, the initialization control line $AZ_m$ goes from a low level to a high level, and the scanning line $SCL_m$ goes from a high level to a low level. Note that the display control line $CL_m$ remains at the high level. Accordingly, at the m'th horizontal scanning period, the write transistor $TR_W$ and first transistor $TR_1$ are in an on state, while the second transistor $TR_2$, third transistor $TR_3$, and fourth transistor $TR_4$ are in an off state.

The second node $ND_2$ and the other source/drain region of the driving transistor $TR_D$ are electrically connected via the first transistor $TR_1$ which is in an on state, and the video signal $V_{Sig}$ from the data line $DT_n$ is applied to the first node $ND_1$ via the write transistor $TR_W$ which is in an on state due to the signal from the scanning line $SCL_m$. Accordingly, the potential of the second node $ND_2$ changes toward a voltage which can be calculated by subtracting the threshold voltage $V_{th}$ of the driving transistor $TR_D$ from the video signal $V_{Sig}$.

According to the above-described initialization process, if the potential of the second node $ND_2$ has been initialized such that the driving transistor $TR_D$ is in an on state at the start of the m'th horizontal scanning period, the potential of the second node $ND_2$ changes toward the potential of the video signal $V_{Sig}$ which is applied to the first node $ND_1$. However, once the potential difference between the gate electrode of the driving transistor $TR_D$ and one source/drain region thereof reaches $V_{th}$, the driving transistor $TR_D$ goes to an off state. In this state, the potential of the second node $ND_2$ is approximately $(V_{Sig}-V_{th})$.

Next, the light emitting unit ELP is driven by applying current to the light emitting unit ELP via the driving transistor $TR_D$.

More detailed description will be made with reference to FIGS. 27A and 28B. At the end of the m'th horizontal scanning period, the scanning line $SCL_m$ goes from a low level to a high level. Also, the display control line $CL_m$ goes from a high level to a low level. Note that the initialization control line $AZ_m$ remains at the high level. The third transistor $TR_3$ and fourth transistor $TR_4$ are in an on state, while the write transistor $TR_W$, first transistor $TR_1$, and second transistor $TR_2$ are in an off state.

Driving voltage $V_{CC}$ is applied to one source/drain region of the driving transistor $TR_D$ via the third transistor $TR_3$ which is in an on state. Also, the other source/drain region of the driving transistor $TR_D$ and one end of the light emitting unit ELP are connected via the fourth transistor $TR_4$ which is in an on state.

The current flowing through the light emitting unit ELP is a drain current $I_{ds}$ which flows from the source region of the driving transistor $TR_D$ to the drain region thereof, so this can be expressed with the following expression (A) assuming that the driving transistor $TR_D$ operates ideally at the saturation region. As shown in FIG. 28B, the drain current $I_{ds}$ is applied to the light emitting unit ELP, and the light emitting unit ELP emits light at a luminance corresponding to the value of the drain current $I_{ds}$.

$$I_{ds}=k\cdot\mu\cdot(V_{gs}-V_{th})^2 \quad \text{(A)}$$

where μ represents effective mobility, L represents channel length, W represents channel width, $V_{gs}$ represents voltage between the source region and gate region of the driving transistor $TR_D$, and $C_{OX}$ represents (relative permittivity of gate insulation layer)×(permittivity of vacuum)/(thickness of gate insulation layer)

in $$k\equiv(1/2)\cdot(W/L)\cdot C_{OX}.$$

Further, since $$V_{gs}\approx V_{CC}-(V_{Sig}-V_{th}) \quad \text{(B)}$$

holds, the above Expression (A) can be rewritten as follows.

$$\begin{aligned} I_{ds} &= k\cdot\mu\cdot(V_{CC}-(V_{Sig}-V_{th})-V_{th})^2 \\ &= k\cdot\mu\cdot(V_{CC}-V_{Sig})^2 \end{aligned} \quad \text{(C)}$$

As can be clearly understood from the above Expression (C), the threshold voltage $V_{th}$ of the driving transistor $TR_D$ has no bearing on the value of the drain current $I_{ds}$. In other words, a drain current $I_{ds}$ corresponding to the video signal $V_{Sig}$ can be applied to the light emitting unit ELP unaffected by the value of the threshold voltage $V_{th}$ of the driving transistor $TR_D$. With the above-described driving method, irregularities in the threshold voltage $V_{th}$ of the driving transistor $TR_D$ do not affect the luminance of the display element.

SUMMARY OF THE INVENTION

For a display device having the above-described display elements to operate, circuits have to be provided which supply signals to the scanning lines, initialization control lines, and display control lines. The circuits for supplying these signals are preferably circuits of an integrated structure, from the perspective of reduction in layout area of the circuits, and reduction of circuit costs. Also, enabling multiple pulse signals to be supplied to the display control lines within one field circuit without affecting the signals supplied to the scanning lines and initialization control lines is preferable from the perspective of reducing flickering of the image displayed on the display device.

It has been found desirable to provide a scan driving circuit capable of supplying signals to the scanning lines, initialization control lines, and display control lines, and capable of supplying multiple pulse signals to the display control lines within one field circuit without affecting the signals supplied to the scanning lines and initialization control lines.

A display device according to an embodiment of the present invention includes:

(1) display elements arrayed in the form of a two-dimensional matrix;

(2) scanning lines, initialization control lines configured to initialize the display elements, and display control lines configured to control lit/unlit states of the display elements, the scanning lines, initialization control lines, and display control lines extending in a first direction;

(3) data lines extending in a second direction different from the first direction; and (4) a scan driving circuit.

A scan driving circuit according to the present invention, and also configuring the display device according to the present invention, includes:

(A) a shift register unit configured of P (wherein P is a natural number of 3 or greater) stages of shift registers, to sequentially shift input start pulses and output output signals from each stage, and (B) a logic circuit unit configured to operate based on output signals from the shift register unit, and enable signals, (C) where, with the output signals of a p'th (where p=1, 2, . . . P−1) stage shift register represented as $ST_p$, the start of a start pulse of an output signal $ST_{p+1}$ of a p+1'th shift register is situated between the start and end of a start pulse of the output signal $ST_p$, (D) and where one each of a first enable signal through a Q'th enable signal (where Q is a natural number of 2 or greater) exist in sequence between the start of the start pulse of the output signal $ST_p$ and the start of the start pulse of the output signal $ST_{p+1}$, (E) and wherein the logic circuit unit includes (P−2)×Q NAND circuits;

wherein a first start pulse through a U'th (where U is a natural number of 2 or greater) start pulse are input to a first stage shift register during a period equivalent to one field period;

and wherein period identifying signals are input to the logic circuit unit to identify each period from a u'th (where u=1, 2, . . . U−1) start pulse in an output signal $ST_1$ to a u+1'th start pulse, and a period from the start of the U'th start pulse to the start of the first start pulse in the next frame;

and wherein, with a q'th enable signal (where q=1, 2, . . . Q−1) represented as $EN_q$, a signal based on a period identifying signal, the output signal $ST_p$, a signal obtained by inverting the output signal $ST_{p+1}$, and the q'th enable signal $EN_q$, are input to a (p', q)'th NAND circuit;

and wherein the operations of the NAND circuit are restricted based on period identifying signals, such that the NAND circuit generates scanning signals based only on a portion of the output signal $ST_p$ corresponding to the first start pulse, the signal obtained by inverting the output signal $ST_{p+1}$, and the q'th enable signal $EN_q$.

With the display device according to an embodiment of the present invention, with regard to a display element receiving supply of signals based on scanning signals from the (p', q)'th NAND circuit (except for a case wherein (p'=1, q=1) via a scanning line, a signal based on a scanning signal from a (p'−1, q')'th NAND circuit in the event that q=1 holds, and a signal based on a scanning signal from a (p', q")'th (wherein q" is a natural number from 1 through (q−1)) NAND circuit in the event that q>1 holds, are supplied from an initialization control line connected to the display element, and a signal based on the output signal $ST_{p+1}$ from a p'+1'th shift register in the event that q=1 holds, and a signal based on an output signal $ST_{p+2}$ from a p'+2'th shift register in the event that q>1 holds, are supplied from a display control line connected to the display element.

Now, from the perspective of shortening the length of wiring from the initialization control line to a predetermined NAND circuit, with a display element where signals based on scanning signals from the (p', q)'th NAND circuit are supplied via a scanning line, a configuration is preferable wherein a signal based on a scanning signal from a (p'−1, q')'th NAND circuit in the event that q=1 holds, and signals based on scanning signals from a (p', q−1)'th NAND circuit in the event that q>1 holds, are supplied from an initialization control line connected to the display element.

With a configuration wherein a first start pulse and a second start pulse are input to a first stage shift register within a period equivalent to one field period, an arrangement may be made wherein a period identifying signals is a signal which is at a low level or a high level in a period from the start of the first start pulse to the start of the second start pulse, and is at a high level or a low level in a period from the start of the second start pulse to the start of the first start pulse in the next frame. Thus, two periods can be identified using a single period identifying signal. Also, with a configuration wherein a first start pulse through a fourth start pulse are input to a first stage shift register within a period equivalent to one field period, an arrangement may be made wherein the period identifying signal is configured of a first period identifying signal and a second period identifying signal, thereby enabling identifying of four periods with the combination of high/low level of the first period identifying signal and second period identifying signal.

An arrangement may be made wherein, in a period including a period where the portion of the output signal $ST_{p'}$ corresponding to the first start pulse is applied, a signal based on the period identifying signal is applied to the input side of the (p', q)'th NAND circuit, such that a signal based on the period identifying signal goes to a high level, but otherwise is at a low level. Note that in the event that the period identifying signal is configured of a first period identifying signal and a second period identifying signal, a signal based on the period identifying signal may be applied to the input side of the (p', q)'th NAND circuit such that a signal based on the first period identifying signal and a signal based on the second period identifying signal both go to a high level only in the period including a period where the portion of the output signal $ST_p$, corresponding to the first start pulse is applied. More specifically, it is sufficient for the period identifying signal to be input to the input side of the NAND circuit, either directly or via a NOR circuit, such that the above-described conditions are satisfied. Accordingly, the operations of the (p', q)'th NAND circuit are restricted, and the NAND circuit only generates scanning signals based on the portion of the output signal $ST_p$ corresponding to the first start pulse, the signal obtained by inverting the output signal $ST_{p+1}$, and the q'th enable signal $EN_q$.

With the display device according to an embodiment of the present invention having the scan driving circuit according to an embodiment of the present invention, signals for the scanning lines, initialization control lines, and display control lines, are supplied based on signals from the scan driving circuit. Accordingly, reduction in layout area of the circuits and reduction of circuit costs can be realized. Values of P and Q, and/or the value of U, should be set as appropriate for the specifications and so forth of the scan driving circuit and display device.

Also, with the display device according to an embodiment of the present invention, the display control lines are supplied with signals based on output signals from shift registers making up the scan driving circuit. With the scan driving circuit according to an embodiment of the present invention, a first start pulse through a U'th start pulse are input to the first stage shift register in a period equivalent to one field period. However, scanning signals output from the NAND circuit are not affected by the number of start pulses input to the first stage shift register. Accordingly, multiple pulse signals can be supplied to a display control line within one field period without affecting signals supplied to scanning lines and initialization control lines, by a simple arrangement of changing the number of start pulses input to the first stage shift register.

Note that the scanning signals from the NAND circuit and the output signals from the shift register should be inverted as appropriate and then supplied, depending on the polarity and the like of the transistors making up the display element. The term "a signal based on a scanning signal" may refer to the scanning signal itself, or may refer to a signal where the polarity of the scanning signal has been inverted. In the same way, the term "a signal based on an output signal from the shift register" may refer to the output signal from the shift register itself, or may refer to a signal where the polarity of the output signal from the shift register has been inverted.

The scan driving circuit according to an embodiment of the present invention can be manufactured by widely-employed semiconductor manufacturing techniques. The shift registers making up the shift register unit, the NAND circuits and NOR circuits configuring the logic circuit unit may be configurations and structures which are widely employed. The scan driving circuit may be configured as an independent circuit, or may be configured integrally with the display device. For example, in the event that the display elements configuring the display device have transistors, the scan driving circuit can be manufactured at the same time with the process for manufacturing the display elements.

With the display device according to an embodiment including various preferred configurations, display elements of a configuration so as to be scanned by signals from scanning lines and subjected to an initialization process based on signals from initialization control lines, and further display elements of a configuration wherein display periods and non-display periods are switched by signals from display control lines, can be widely used.

The display elements configuring the display device according to an embodiment of the present invention may include:

(1-1) a driving circuit including a write transistor, a driving transistor, and a capacitance unit; and (1-2) a light emitting unit to which current is applied via the driving transistor. The light-emitting unit may be configured of a light emitting unit which emits light under application of electric current, examples of which include an organic electroluminescence unit, an inorganic electroluminescence unit, an LED light emitting unit, a semiconductor laser light emitting unit, and so forth. Of these, a configuration of light emitting units which are organic electroluminescence units is preferable from the perspective of configuring a flat display device for color display.

With the driving circuit configuring the display element as described above (hereinafter, may be referred to as "driving circuit configuring the display element according to an embodiment of the present invention"), an arrangement may be made wherein, with regard to the write transistor, (a-1) one source/drain region is connected to the data line, and (a-2) the gate electrode is connected to the scanning line;

and wherein, with regard to the driving transistor, (b-1) one source/drain region is connected to the other source/drain region of the write transistor, thereby configuring a first node;

and wherein, with regard to the capacitance unit, (c-1) a predetermined reference voltage is applied to one end thereof, and (c-2) the other end is connected with the gate electrode of the driving transistor, thereby configuring a second node;

and wherein the write transistor is controlled by signals from the scanning line.

The driving circuit configuring the display element according to an embodiment of the present invention may further include (d) a first switch circuit unit connected between the second node and the other source/drain region of the driving transistor;

wherein the first switch circuit unit is controlled by signals from the scanning line.

The driving circuit configuring the display element including the above-described preferred configuration of an embodiment of the present invention may further include (e) a second switch circuit unit connected between the second node and a power supply line to which a predetermined initialization voltage is applied;

wherein the second switch circuit unit is controlled by signals from the initialization control line.

The driving circuit configuring the display element including the above-described preferred configuration of an embodiment of the present invention may further include (f) a third switch circuit unit connected between the first node and a power supply line to which a driving voltage is applied;

wherein the third switch circuit unit is controlled by signals from the display control line.

The driving circuit configuring the display element including the above-described preferred configuration of an embodiment of the present invention may further include (g) a fourth switch circuit unit connected between the other source/drain region of the driving transistor and one end of the light emitting unit;

wherein the fourth switch circuit unit is controlled by signals from the display control line.

With a display device having a driving circuit including the above-described first switch circuit unit through fourth switch circuit unit, the light emitting unit may be driven by (a) performing an initialization process of applying a predetermined initial voltage from a power supply line to a second node via the second switch circuit unit in an on state, following which the second switch circuit unit is placed in an off state, thereby setting the potential of the second node to a predetermined reference potential;

(b) performing a writing process of maintaining the off state of the second switch circuit unit, third switch circuit unit, and fourth switch circuit unit, while placing the first switch circuit unit in an on state, and in a state where the second node and the other source/drain region of the driving transistor are electrically connected by the first switch circuit unit in the on state, a video signal is applied to the first node form the data line via the write transistor placed in an on state by a signal from the scanning line, thereby changing the potential of the second node toward a potential which can be calculated by subtracting the threshold voltage of the driving transistor from the video signal;

(c) subsequently placing the write transistor in an off state by a signal from the scanning line; and (d) and subsequently maintaining the off state of the first switch circuit unit and second switch circuit unit while electrically connecting the other source/drain region of the driving transistor to one end of the light emitting unit via the fourth switch circuit unit in the on state, and applying a predetermined driving voltage to the first node from the power supply line via the third switch circuit unit in the on state, thereby applying current to the light emitting unit via the driving transistor, and thus driving the light emitting unit.

With the driving circuit configuring the display device according to an embodiment of the present invention, a predetermined reference voltage is applied to one end of the capacitance unit, whereby the potential at the one end of the capacitance unit is maintained when the display device is operating. The value of the predetermined reference voltage is not restricted in particular. For example, a configuration may be made wherein one end of the capacitance unit is connected to a power supply line for applying predetermined voltage to the other end of the light emitting unit, so that the predetermined voltage is applied as the reference voltage.

With the display device according to an embodiment of the present invention including the above-described various preferred configurations, the configurations and structures of various wiring such as the scanning lines, initialization control lines, display control lines data lines, power supply lines, and so forth, may be of configurations and structures widely in use. Also, the configuration and structure of the light emitting unit may be of configurations and structures widely in use. Specifically, in the case of forming the light emitting unit as an organic electroluminescence light emitting unit, the light emitting unit may be configured of an anode electrode, hole transporting layer, emissive layer, electron transporting layer, cathode electrode, and so forth. Also, the configuration and structure of the signal output circuit connected to the data line, and so forth, may be of configurations and structures widely in use.

The display device according to an embodiment of the present invention may be of a so-called black-and-white display configuration, or may be of a configuration wherein each pixel is configured of multiple sub-pixels, specifically, a configuration wherein a pixel is confirmed of the three sub pixels of a red light emitting sub-pixel, a green light emitting sub-pixel, and a blue light emitting sub-pixel. Further, a pixel may be configured of a set where one type of multiple types of sub-pixels are added to the above three types of sub pixels (e.g., a set wherein a sub-pixel emitting white light is added for improving luminance, set wherein a sub-pixel emitting a complementary color is added for expanding the range of color reproduction, a set wherein a sub-pixel emitting yellow light is added for expanding the range of color reproduction, a set wherein sub-pixels emitting yellow and cyan light are added for expanding the range of color reproduction).

Examples of image display resolution regarding the number of pixels of the display device include, but are not restricted to, VGA (640, 480), S-VGA (800, 600), XGA (1024, 768), APRC (1152, 900), S-XGA (1280, 1024), U-XGA (1600, 1200), HD-TV (1920, 1080), Q-XGA (2048, 1536) and so forth, and also (1920, 1035), (720, 480), (1280, 960) and so forth. In the case of a black-and-white display device, basically, display elements of the same number as the number of pixels are formed in matrix fashion. In the case of a color display device, basically, display elements threefold the number of pixels are formed in matrix fashion. The display elements may be formed in a striped array, or in a delta array, and should be arrayed as appropriate in accordance with the design of the display device.

With the driving circuit making up the display element according to an embodiment of the present invention, the write transistor and driving transistor may be configured of p-channel type thin-film transistors (TFT), for example. Note that the write transistor may be an n-channel type instead. The first switch circuit unit, second switch circuit unit, third switch circuit unit, and fourth switch circuit unit may be configured of widely-used switching devices such as TFTs, and may be p-channel type TFTs or n-channel type TFTs, for example.

With the driving circuit making up the display element according to an embodiment of the present invention, the capacitance unit making up the driving circuit may be configured of one electrode, another electrode, and a dielectric layer (insulating layer) between these electrodes. The transistors and capacitance unit making up the driving circuit may be formed within a certain plane, and formed on a supporting body, for example. In the event that the light emitting unit is to be an organic electroluminescence light emitting unit, the light emitting unit may be formed above the transistors and capacitance unit making up the driving circuit. Also, the other source/drain region of the driving transistor may be connected to one end of the light emitting unit (anode electrode provided to the light emitting unit, etc.) via another transistor, for example. Also note that a configuration may be employed wherein transistors are formed on a semiconductor substrate.

Note that in the Present Specification, the term "one source/drain region" may be used regarding the one of the two source/drain regions which a transistor has, which is connected to the power source side. Also, the term that a transistor is in an "on state" means that a channel is formed between the source/drain regions, regardless of whether or not current is flowing from one source/drain region to the other source/drain region. Conversely, the term that a transistor is in an "off state" means that no channel is formed between the source/drain regions. The expression that a source/drain region of a certain transistor is connected to a source/drain region of another transistor means that the source/drain region of the certain transistor and the source/drain region of the other transistor occupy the same region. Further, the source/drain regions are not restricted to being configured of impurity-doped polysilicon, amorphous silicon, and the like, and may also be configured of layered strictures thereof, or layers of organic material (electroconductive polymers). Moreover, in the timing charts used for description in the Present Specification, it should be noted that the length of the horizontal axis representing periods (length of time) is a schematic representation, not necessarily indicating the ratio of duration of the time periods.

With the display device according to an embodiment of the present invention having the scan driving circuit according to an embodiment of the present invention, signals for the scanning lines, initialization control lines, and display control lines, are supplied based on signals from the scan driving circuit. Accordingly, reduction in layout area of the circuits and reduction of circuit costs can be realized.

With the scan driving circuit according to an embodiment of the present invention, multiple pulse signals can be supplied to a display control line within one field period without affecting signals supplied to scanning lines and initialization control lines, by a simple arrangement of changing the number of start pulses input to the first stage shift register. Also, with the display device according to an embodiment of the present invention, flickering of the image displayed on the display device can be reduced by a simple arrangement of changing the number of start pulses input to the first stage shift register configuring the scan driving circuit.

DESCRIPTION OF THE PREFERRED EMBODIMENTS

Embodiments of the present invention will be described with reference to the drawings.

First Embodiment

The first embodiment relates to a scan driving circuit and to a display device having the scan driving circuit. The display device according to the first embodiment is a display device which uses display elements having a light emitting unit and a driving circuit thereof.

Figure 1:
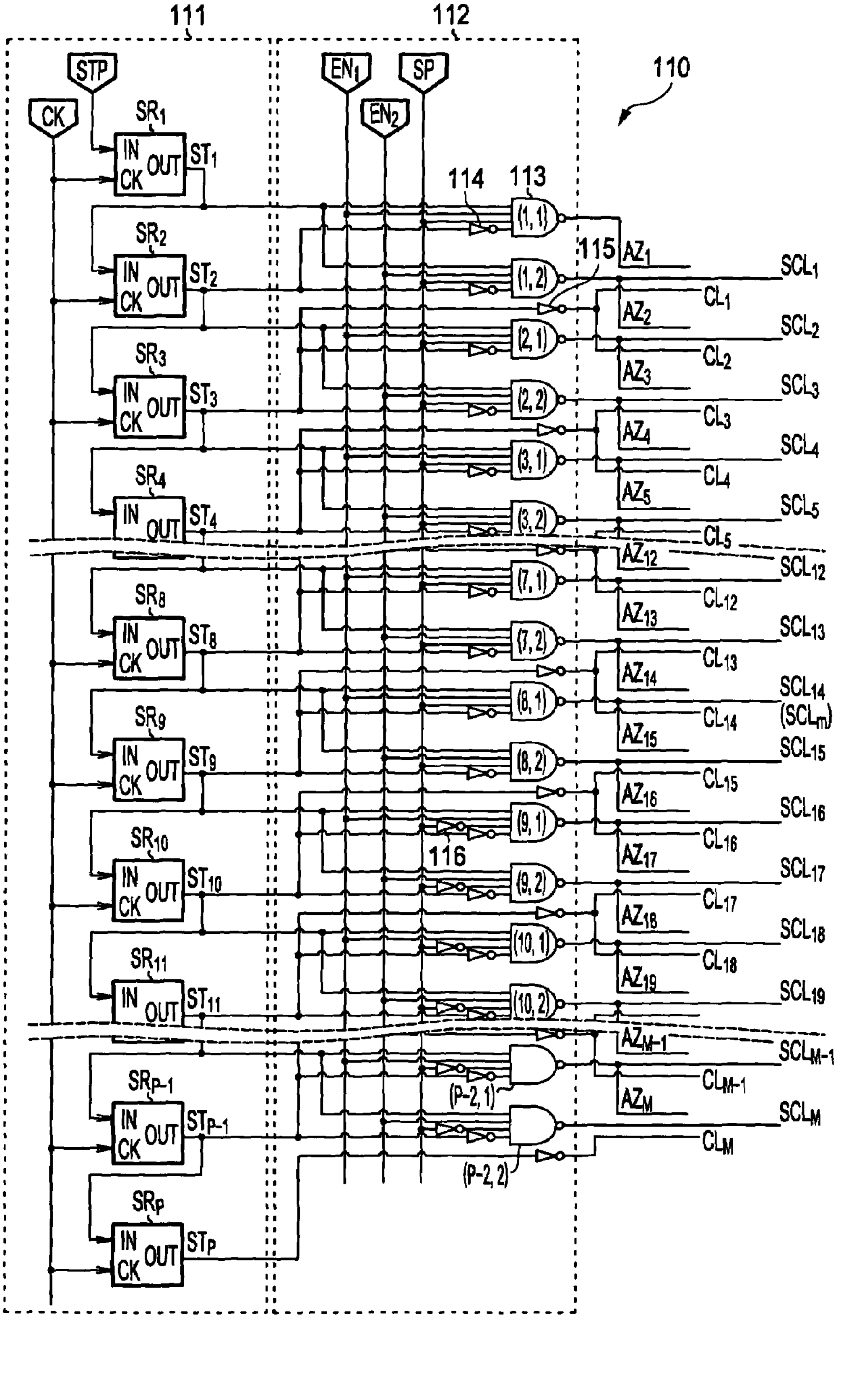
FIG. 1 is a circuit diagram of a scan driving circuit according to a first embodiment.
Figure 2:
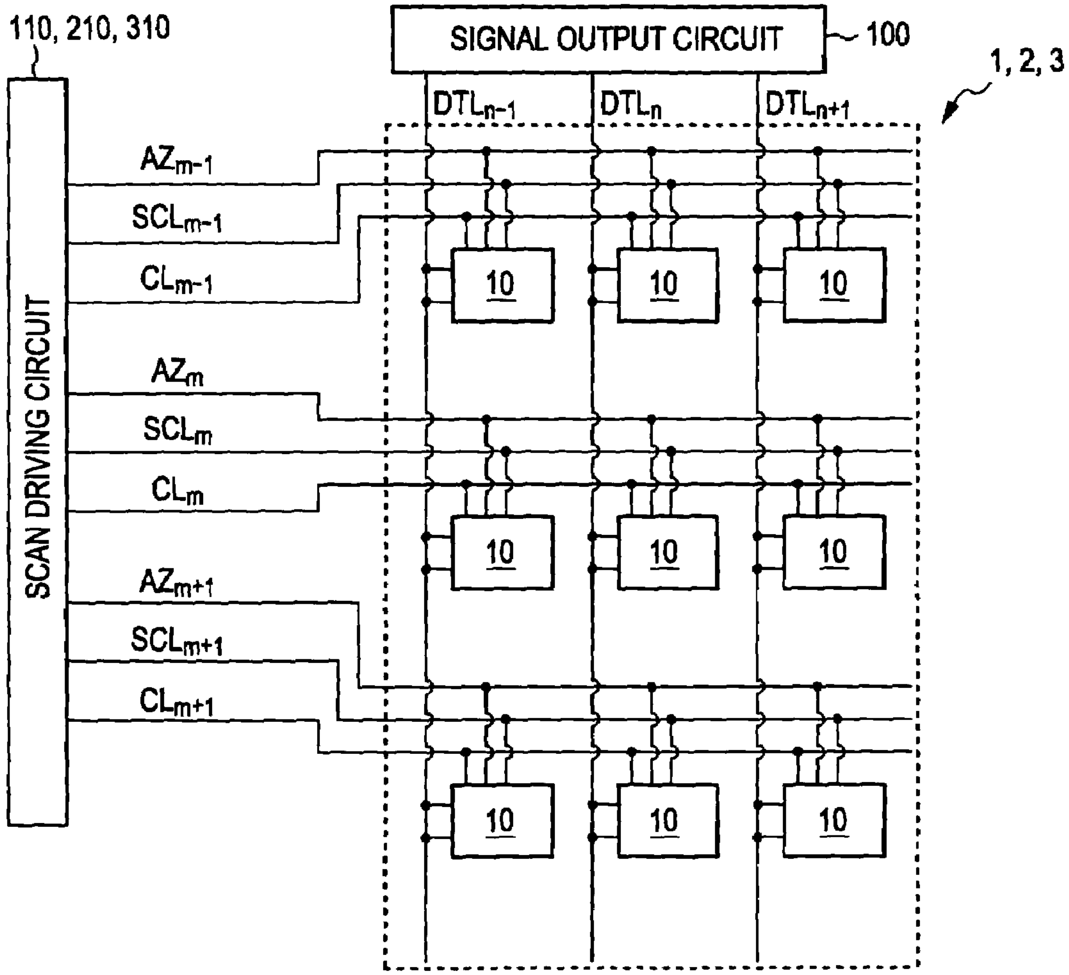
FIG. 2 is a conceptual diagram of a display device according to the first embodiment, including the scan driving circuit shown in FIG. 1.
Figure 3:
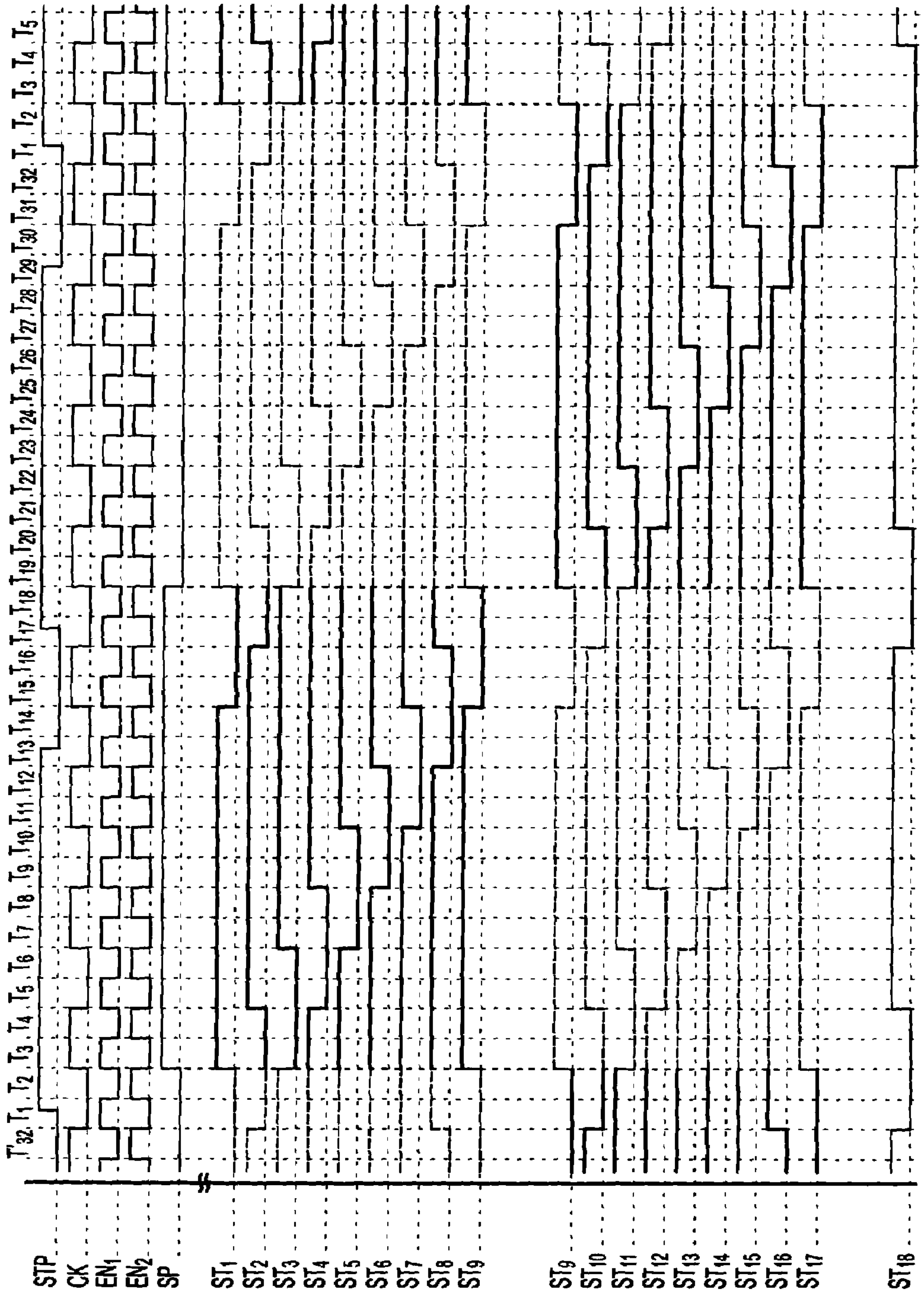
FIG. 3 is a schematic timing chart of a shift register unit making up the scan driving circuit shown in FIG. 1.
Figure 4:
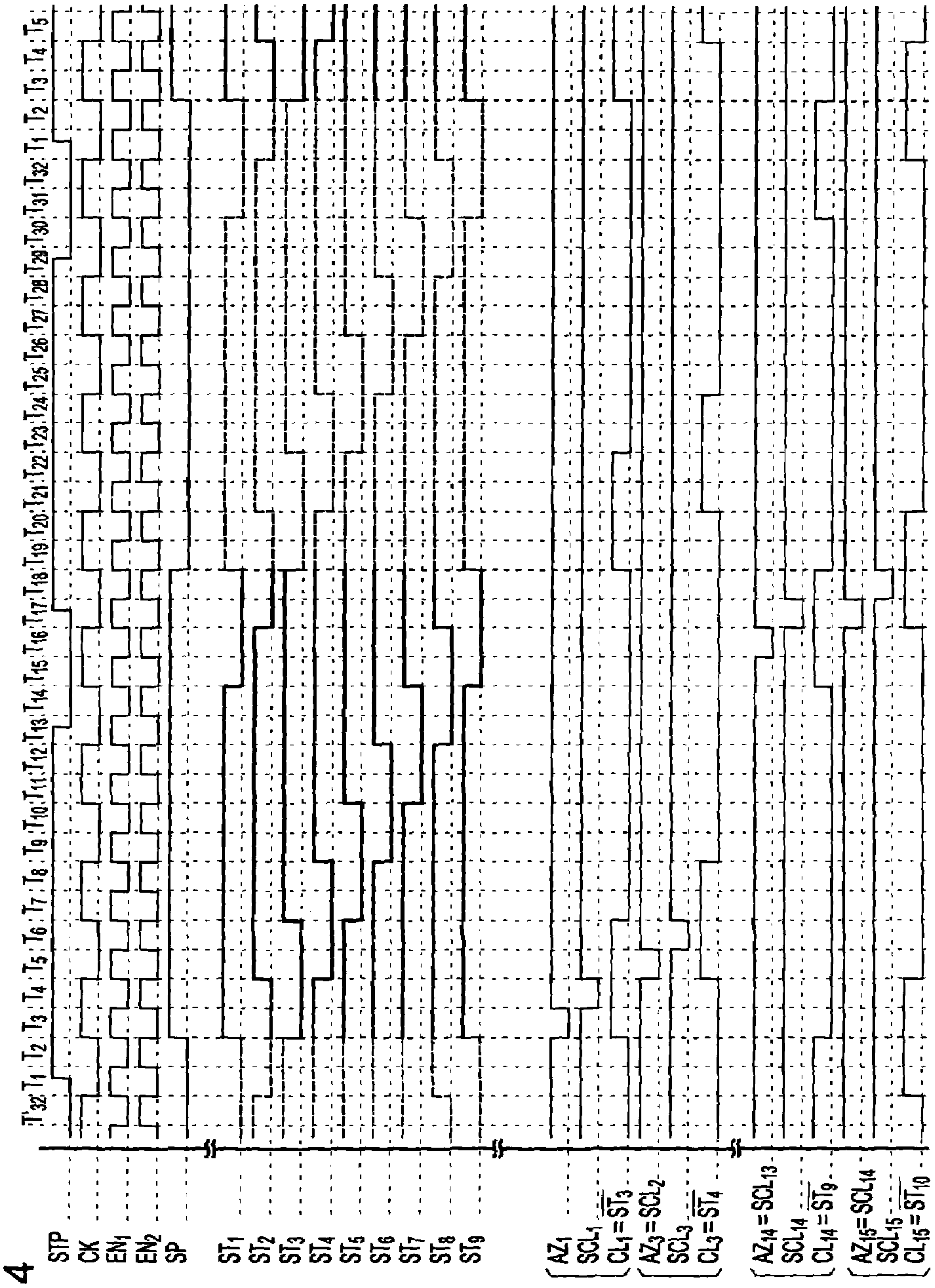
FIG. 4 is a schematic timing chart of an upstream stage of a logic circuit unit making up the scan driving circuit shown in FIG. 1.
Figure 5:
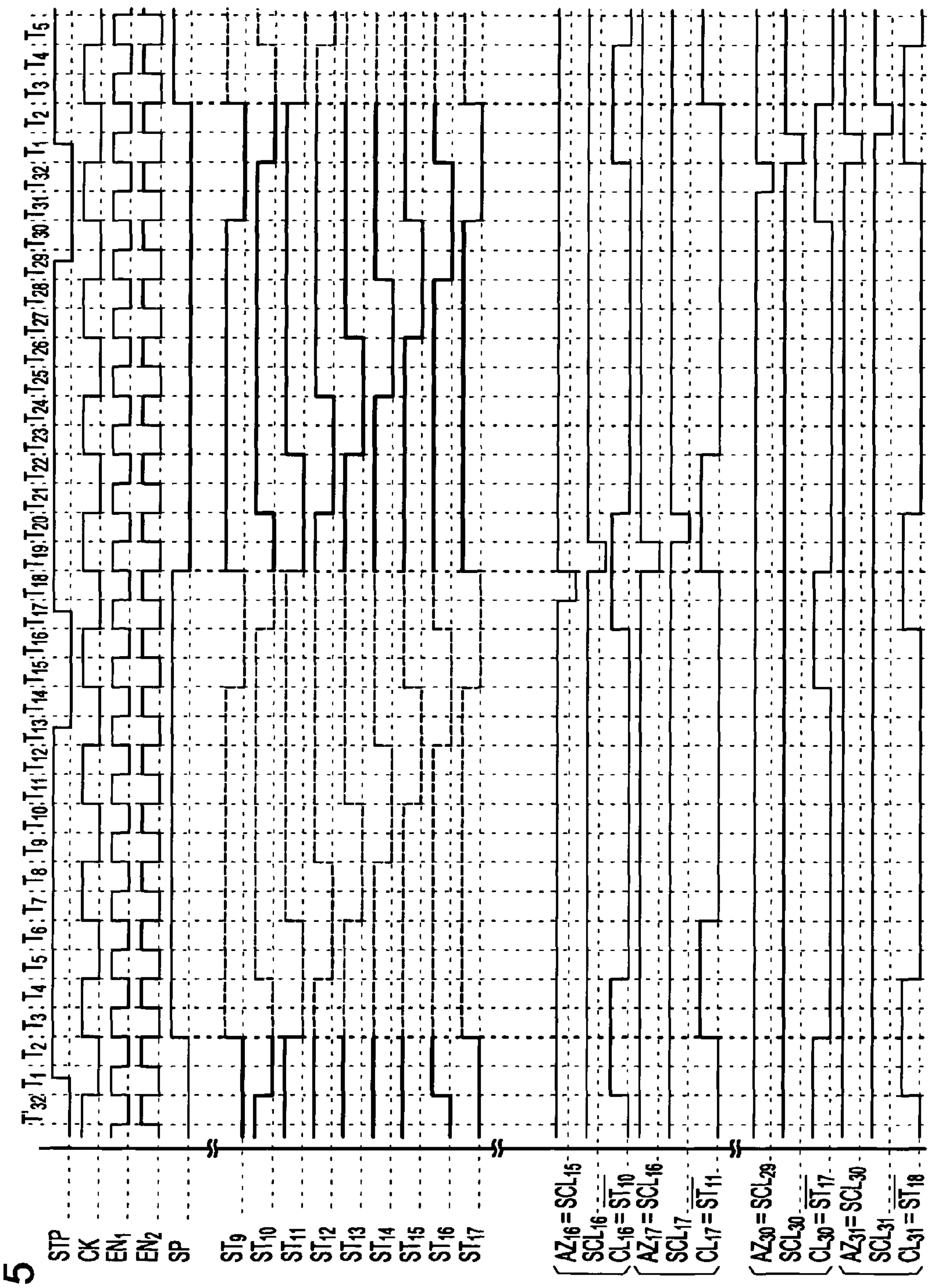
FIG. 5 is a schematic timing chart of a downstream stage of a logic circuit unit making up the scan driving circuit shown in FIG. 1.
Figure 6:
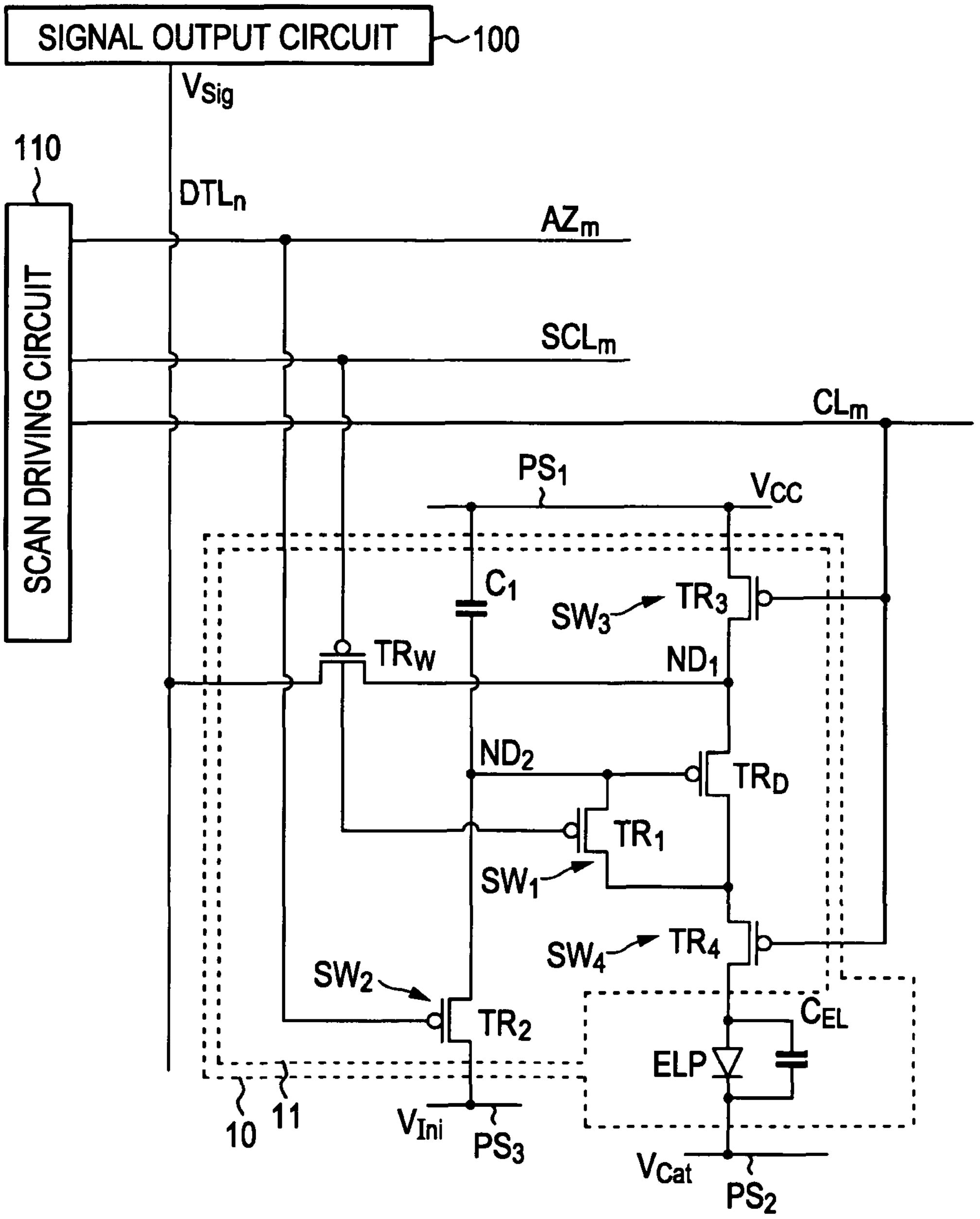
FIG. 6 is an equivalent circuit diagram of a driving circuit making up a display element at the m'th row and n'th column of the display device shown in FIG. 2.

FIG. 1 is a circuit diagram of a scan driving circuit 110 according to the first embodiment, FIG. 2 is a conceptual diagram of a display device 1 according to the first embodiment, including the scan driving circuit shown in FIG. 1, FIG. 3 is a schematic timing chart of a shift register unit 111 configuring the scan driving circuit 110 shown in FIG. 1, FIG. 4 is a schematic timing chart of an upstream stage of a logic circuit unit 112 configuring the scan driving circuit 110 shown in FIG. 1, FIG. 5 is a schematic timing chart of a downstream stage of the logic circuit unit 112 making up the scan driving circuit 110 shown in FIG. 1, and FIG. 6 is an equivalent circuit diagram of a driving circuit 11 making up a display element 10 at the m'th (where m=1, 2, 3 . . . M) row and n'th (where n=1, 2, 3 . . . N) column of the display device shown in FIG. 2.

First, the overview of the display device 1 will be described. As shown in FIG. 2, the display device 1 includes:

(1) display elements 10 arrayed in the form of a two-dimensional matrix;

(2) scanning lines SCL, initialization control lines AZ configured to initialize the display elements 10, and display control lines CL configured to control lit/unlit states of the display elements, extending in a first direction;

(3) data lines DTL extending in a second direction different from the first direction; and (4) a scan driving circuit 110. The scanning lines SCL, initialization control lines AZ, and display control lines CL are connected to the scan driving circuit 110. The data lines DTL are connected to a signal output circuit 100. Note that in FIG. 2, 3×3 display elements 10 are shown centered on a display element 10 at the m'th row and n'th column, but this is only an exemplary illustration. Also, the power supply lines $PS_1$, $PS_2$, and $PS_3$, shown in FIG. 6, have been omitted from FIG. 2.

N display elements 10 are arrayed in the first direction and M are arrayed in the second direction which is different from the first direction. The display device 1 is configured of N/3×M pixels arrayed on a two-dimensional matrix form. One pixel is configured of three sub-pixels (a red light emitting sub-pixel which emits red light, a green light emitting sub-pixel which emits green light, and a blue light emitting sub-pixel which emits blue light). The display elements 10 making up the pixels are driven in line sequence, at a display frame rate of FR (times/second). That is to say, the display elements 10 making up of each of the N/3 pixels arrayed at the m'th row (N sub-pixels) are driven at the same time. In other words, the lit/unlit timing of the display elements 10 making up one row are subjected to control in increments of the row to which they belong.

As shown in FIG. 6, a display element 10 is configured of a driving circuit 11 having a write transistor $TR_W$, driving transistor $TR_D$, and capacitance unit $C_1$, and a light emitting unit ELP to which current is applied via the driving transistor $TR_D$. The light emitting unit ELP is configured of an electroluminescence light emitting unit. The display element 10 has a structure wherein the driving circuit 11 and the light emitting unit ELP are layered. The driving circuit 11 further has a first transistor $TR_1$, second transistor $TR_2$, third transistor $TR_3$, and fourth transistor $TR_4$; these transistors will be described later.

With the display element 10 at the m'th row and n'th column, one source/drain region of the write transistor $TR_W$ us connected to the data line $DTL_n$, and the gate electrode is connected to the scanning line $SCL_m$. At the driving transistor $TR_D$, one source/drain region is connected to the other source/drain region of the write transistor $TR_W$, thereby configuring a first node $ND_1$. One end of the capacitance unit $C_1$ is connected to the power supply line $PS_1$. At the capacitance unit $C_1$, a predetermined reference voltage (a later-described predetermined driving voltage $V_{CC}$ in the first embodiment) is applied to one end thereof, and the other end thereof is connected to the gate electrode of the driving transistor $TR_D$, thereby configuring a second node $ND_2$. The write transistor $TR_W$ is controlled by signals from the scanning line $SCL_m$.

Video signals (driving signals, luminance signals) $V_{Sig}$ are applied to the data line $DTL_n$ from the signal output circuit 100 to control luminance a the light emitting unit ELP, a point which will be described later.

The driving circuit 11 further has a first switch circuit unit $SW_1$ connected between the second node $ND_2$ and the other source/drain region of the driving transistor $TR_D$. The first switch circuit unit $SW_1$ is configured of the first transistor $TR_1$. At the first transistor $TR_1$, one source/drain region is connected to the second node $ND_2$, and the other source/drain region is connected to the other source/drain region of the driving transistor $TR_D$. The gate electrode of the first transistor $TR_1$ is connected to the scanning line $SCL_m$, and the first transistor $TR_1$ is controlled by signals from the scanning line $SCL_m$.

The driving circuit 11 further has a second switch circuit unit $SW_2$ connected between the second node $ND_2$ and the power supply line $PS_3$ to which the later-described predetermined initialization voltage $V_{Ini}$ is applied. The second switch circuit unit $SW_2$ is configured of the second transistor $TR_2$. At the second transistor $TR_2$, one source/drain region is connected to the power supply line $PS_3$, and the other source/drain region is connected to the second node $ND_2$. The gate electrode of the second transistor $TR_2$ is connected to the initialization control line $AZ_m$, and the second transistor $TR_2$ is controlled by signals from the initialization control line $AZ_m$.

The driving circuit 11 further has a third switch circuit unit $SW_3$ connected between the first node $ND_1$ and the power supply line $PS_1$ to which the driving voltage $V_{CC}$ is applied. The third switch circuit unit $SW_3$ is configured of the third transistor $TR_3$. At the third transistor $TR_3$, one source/drain region is connected to the power supply line $PS_1$, and the other source/drain region is connected to the first node $ND_1$. The gate electrode of the third transistor $TR_3$ is connected to the display control line $CL_m$, and the third transistor $TR_3$ is controlled by signals from the display control line $CL_m$.

The driving circuit 11 further has a fourth switch circuit unit $SW_4$ connected between the other source/drain region of the driving transistor $TR_D$ and one end of the light emitting unit ELP. The fourth switch circuit unit $SW_4$ is configured of the fourth transistor $TR_4$. At the fourth transistor $TR_4$, one source/drain region is connected to other source/drain region of the driving transistor $TR_D$, and the other source/drain region is connected to one end of the light emitting unit ELP. The gate electrode of the fourth transistor $TR_4$ is connected to the display control line $CL_m$, and the fourth transistor $TR_4$ is controlled by signals from the display control line $CL_m$. The other end of the light emitting unit ELP (cathode electrode) is connected to the power supply line $PS_2$, whereby a later-described voltage $V_{Cat}$ is applied. The symbol $C_{EL}$ represents the capacitance of the light emitting unit ELP.

The driving transistor $TR_D$ is configured of a p-channel type TFT, and the write transistor $TR_W$ also is configured of a p-channel type TFT. Further, the first transistor $TR_1$, second transistor $TR_2$, third transistor $TR_3$, and fourth transistor $TR_4$ are also configured of a p-channel type TFTs. Note that the write transistor $TR_W$ may be configured of an n-channel type TFT instead. The transistors are described as being depression type transistors, but are not restricted to this.

Widely-used configurations and structures may be used for the configurations and structures of the signal output circuit 100, scanning lines SCL, initialization control lines AZ, display control lines CL, and data lines DTL. The power supply lines $PS_1$, $PS_2$, and $PS_3$ extending in the same first direction as the scanning lines SCL are connected to an unshown power source unit. The driving voltage $V_{CC}$ is applied to the power supply line $PS_1$, the voltage $V_{Cat}$ is applied to the power supply line $PS_2$, and the initialization voltage $V_{Ini}$ is applied to the power supply line $PS_3$. Widely-used configurations and structures may be used for the configurations and structures of the power supply lines $PS_1$, $PS_2$, and $PS_3$ as well.

Figure 7:
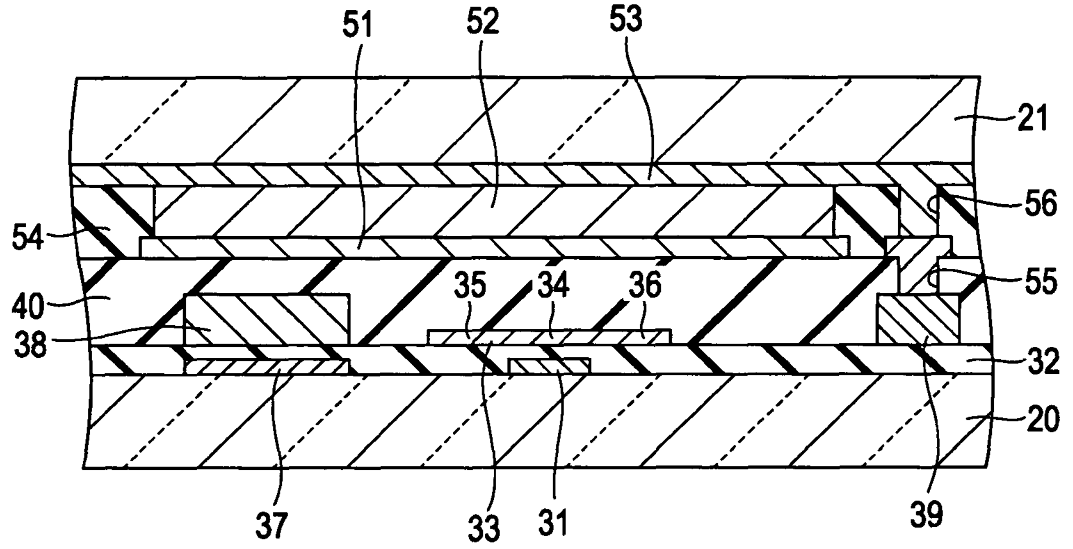
FIG. 7 is a partial cross-sectional diagram of a portion of a display element making up the display device shown in FIG. 2.

FIG. 7 is a partial cross-sectional diagram of a portion of a display element 10 making up the display device 1 shown in FIG. 2. Each transistor and the capacitance unit $C_1$ making up the driving circuit 11 of the display element 10 are formed on a supporting body 20, and the light emitting unit ELP is formed above the transistors and the capacitance unit $C_1$ making up the driving circuit 11, with an inter-layer insulating layer 40 introduced therebetween, an arrangement which will be described later. The light emitting unit ELP has a widely-used configuration and structure of an anode electrode, hole transporting layer, emissive layer, electron transporting layer, cathode electrode, and so forth, for example. Note that in FIG. 7, only the driving transistor $TR_D$ is shown, and other transistors are hidden and are not visible. The other source/drain region of the driving transistor $TR_D$ is electrically connected to an anode electrode provided to the light emitting unit ELP via the unshown fourth transistor $TR_4$, the connection between the fourth transistor $TR_4$ and the anode electrode of the light emitting unit ELP also not being visible.

The driving transistor $TR_D$ is configured of a gate electrode 31, gate insulating layer 32, and semiconductor layer 33. More specifically, the driving transistor $TR_D$ has a channel formation region 34 corresponding to the semiconductor layer 33 between the one source/drain region 35 and the other source/drain region 36 provided to the semiconductor layer 33. The other unshown transistors are also of similar configuration.

The capacitance unit $C_1$ is configured of an electrode 37, a dielectric layer configured of an extended portion of the gate insulating layer 32, and an electrode 38. Note that the connection between the electrode 37 and the gate electrode 31 of the driving transistor $TR_D$, and the connection between the electrode 38 and the power supply line $PS_1$, are not visible.

The gate electrode 31, part of the gate insulating layer 32, and the electrode 37 making up the capacitance unit $C_1$, are formed on the supporting body 20. The driving transistor $TR_D$ and capacitance unit $C_1$ and so forth are covered with the inter-layer insulating layer 40, with the light emitting unit ELP configured of an anode electrode 51, hole transporting layer, emissive layer, electron transporting layer, and cathode electrode 53 provided upon the inter-layer insulating layer 40. Note that in FIG. 7, the hole transporting layer, emissive layer, and electron transporting layer are represented with a single layer 52. A second inter-layer insulating layer 54 is provided on the inter-layer insulating layer 40 where the light emitting unit ELP is not provided, a transparent substrate 21 us disposed above the second inter-layer insulating layer 54 and cathode electrode 53, and the light emitted at the emissive layer is externally emitted through the substrate 21. Wiring 39 making up the cathode electrode 53 and power supply line $PS_2$ is connected thereto via contact holes 56 and 55 provided in the second inter-layer insulating layer 54 and inter-layer insulating layer 40, respectively.

A manufacturing method of the display device shown in FIG. 7 will be described. First, the various types of wiring for the scanning lines and so forth, electrodes making up the capacitance units, transistors formed of semiconductor layers, inter-layer insulating layers, contact holes, and so forth, are formed on the supporting body 20 by techniques which are widely employed. Next, film formation and patterning is performed by techniques which are widely employed, thereby forming light emitting units ELP arrayed in matrix fashion. The supporting body 20 which has been subjected to the above processes is made to face a substrate 21 and the perimeter thereof is sealed. This is then connected with the signal output circuit 100 and scan driving circuit 110, whereby a display device can be completed.

Next, the scan driving circuit 110 will be described. Note that description of the scan driving circuit 110 will be made with reference to an arrangement wherein scanning signals for supply to scanning line $SCL_1$ through scanning line $SCL_{31}$ in line sequence, to facilitate description. Description will be made in this way in other embodiments as well.

As shown in FIG. 1, the scan driving circuit 110 includes:

(A) a shift register unit 111 configured of P (wherein P is a natural number of 3 or greater, hereinafter the same) stages of shift registers SR, to sequentially shift input start pulses STP and output output signals ST from each stage; and (B) a logic circuit unit 112 configured to operate based on output signals ST from the shift register unit 111, and enable signals (with the first embodiment, later-described first enable signal $EN_1$ and second enable signal $EN_2$).

With the output signals of a p'th (where p=1, 2, . . . P−1) stage shift register $SR_p$ represented as $ST_p$, the start of a start pulse of an output signal $ST_{p+1}$ of a p+1'th shift register $SR_{p+1}$ is situated between the start and end of a start pulse of the output signal $ST_p$, as shown in FIG. 3. The shift register unit 111 operates based on clock signals CK and start pulses STP, so as to satisfy the above conditions.

The first stage shift register $SR_1$ receives input of a first start pulse through a U'th start pulse (wherein U is a natural number of 2 or greater, hereinafter the same) within a period equivalent to one field period (in FIG. 3, a period equivalent from the start of period $T_1$ through the end of period $T_{32}$. Note that in the first embodiment, U=2, and a first start pulse and a second start pulse are input.

Specifically, the first start pulse input to the first stage shift register $SR_1$ has the leading edge thereof between the start and end of the period $T_1$ shown in FIG. 3, and has the trailing edge thereof between the start and end of the period $T_{13}$. Also, the second start pulse has the leading edge thereof between the start and end of the period $T_{17}$ shown in FIG. 3 and has the trailing edge thereof between the start and end of the period T29. Each period such as $T_1$ in FIG. 3 and other later-described drawings correspond to one horizontal scanning period (also represented by "1H"). The clock signal CK is a square wave signal which inverts polarity every two horizontal scanning periods (2H).

The first start pulse in the output signal $ST_1$ of the shift register $SR_1$ has the leading edge thereof at the start of the period $T_3$, and has the trailing edge at the end of period $T_{14}$. The first pulse in the output signals $ST_2$, $ST_3$, and so on, for the shift register $SR_2$ and subsequent shift registers is a pulse which has been sequentially shifted by two horizontal scanning periods. Also, second start pulse in the output signal $ST_1$ of the shift register $SR_1$ has the leading edge thereof at the start of the period $T_{19}$, and has the trailing edge at the end of period $T_{30}$. The first pulse in the output signals $ST_2$, $ST_3$, and so on, for the shift register $SR_2$ and subsequent shift registers is also a pulse which has been sequentially shifted by two horizontal scanning periods.

Also, one each of a first enable signal through a Q'th enable signal (where Q is a natural number of 2 or greater, hereinafter the same) exist in sequence between the start of the first start pulse of the output signal $ST_p$ and the start of the first start pulse of the output signal $ST_{p+1}$. In the first embodiment Q=2, and there are one each of the first enable signal $EN_1$ and the second enable signal $EN_2$, in sequence. In other words, the first enable signal $EN_1$ and the second enable signal $EN_2$ are signals generated so as to satisfy the above conditions, which basically are square wave signals of the same cycle but with different phases. Note that one each of a first enable signal through a Q'th enable signal also exist in sequence between the start of the second start pulse of the output signal $ST_p$ and the start of the second start pulse of the output signal $ST_{p+1}$.

Specifically, the first enable signal $EN_1$ and the second enable signal $EN_2$ are square wave signals having two horizontal scanning periods as one cycle. In the first embodiment, these signals invert polarity every horizontal scanning period, and the first enable signal $EN_1$ and the second enable signal $EN_2$ are in inverse phase relation. While FIGS. 3 through 5 show the high level of the enable signals $EN_1$ and $EN_2$ as lasting for one horizontal scanning period, the present invention is not restricted to this arrangement, and the high level may be a square wave signal with a period shorter than one horizontal scanning period, a point which holds true with the other embodiments as well.

For example, there sequentially exist one each of the first enable signal $EN_1$ in the period $T_3$ and the second enable signal $EN_2$ in the period $T_4$, between the start of the start pulse in output signal $ST_1$ (i.e., the start of period $T_3$) and the start of the start pulse in output signal $ST_2$ (i.e., the start of period $T_3$). In the same way, there sequentially exist one each of the first enable signal $EN_1$ and the second enable signal $EN_2$, between the start of the start pulse in output signal $ST_2$ and the start of the start pulse in output signal $ST_3$. This is the same for output signal $ST_4$ and on.

As shown in FIG. 1, the logic circuit unit 112 has (P−2)×Q NAND circuits 113. Specifically, the logic circuit unit 112 has (1, 1)'th through (P−2, 2)'th NAND circuits 113. Period identifying signals SP for identifying each period from the start of the u'th start pulse (where u=1, 2, . . . U−1, hereinafter the same) start pulse in an output signal $ST_1$ to the start of a (u+1)'th start pulse, and a period from the start of the U'th start pulse to the start of the first start pulse in the next frame, are input to the logic circuit unit 112.

In the first embodiment, U=2, and the period identifying signal SP is a signal for identifying the period from the start of the first start pulse in the output signal $ST_1$ to the start of the second start pulse, and the period from the start of the second start pulse in output signal $ST_1$ to the start of the first start pulse in the next frame. In FIGS. 3 through 5, the period from the start of the first start pulse in the output signal $ST_1$ to the start of the second start pulse is a period from the start of period $T_3$ to the end of period $T_{18}$. Also, the period from the start of the second start pulse in output signal $ST_1$ to the start of the first start pulse in the next frame is a period from the start of period $T_{19}$ to the end of period $T_2$ in the next frame. In the first embodiment, the period identifying signal SP is a signal which is at high level during the period from the start of period $T_3$ to the end of period $T_{18}$, and at low level during the period from the start of period $T_{19}$ to the end of period $T_2$ of the next frame.

With a q'th enable signal (where q is an arbitrary number from 1 to Q, hereinafter the same) represented as $EN_q$, a signal based on the period identifying signal SP, the output signal $ST_p$, a signal obtained by inverting the output signal $ST_{p+1}$, and the q'th enable signal $EN_q$, are input to a (p', q)'th NAND circuit 113 (where p is an arbitrary natural number from 1 to (P−2), hereinafter the same). As described later, the operations of the NAND circuit 113 are restricted based on the period identifying signal SP, such that the NAND circuit 113 generates scanning signals based only on a portion of the output signal $ST_{p'}$ corresponding to the first start pulse, the signal obtained by inverting the output signal $ST_{p'+1}$, and the q'th enable signal $EN_q$.

More specifically, the output signal $ST_{p'+1}$ is inverted by the NOR circuit 114 shown in FIG. 1, and input to the input side of the (p', q)'th NAND circuit 113. The output signal $ST_{p'}$ and the q'th enable signal $EN_q$ are directly input to the input side of the (p', q)'th NAND circuit 113. Also, the period identifying signal SP is directly input to the input side of the (1, 1)'th through (8, 2)'th NAND circuits 113, as a signal based on the period identifying signal SP. the period identifying signal SP inverted by a NOR circuit 116 shown in FIG. 1 is input to the input side of the (9, 1)'th and subsequent NAND circuits 113, as a signal based on the period identifying signal SP.

As described above, the first start pulse and second start pulse are input to the first stage shift register $SR_1$ within a period equivalent to one field period. If the (p', q)'th NAND circuit 113 were to operate only by the output signal $ST_{p'}$, a signal obtained by inverting the output signal $ST_{p'+1}$, and the q'th enable signal $EN_q$, the NAND circuit 113 would generate two scanning signals in the one field period. This will be described in detail next.

Let us consider the (8, 1)'th NAND circuit 113. Signals based on the scanning signals from the (8, 1)'th NAND circuit 113 are supplied to the scanning line $SCL_{14}$. As shown in FIG. 4, in the period $T_{17}$ in which the scanning signal should be generated, the output signal $ST_8$, the signal obtained by inverting the output signal $ST_9$, and the first enable signal $EN_1$, are at high level. However, the first stage shift register $SR_1$ has also received input of the second start pulse in addition to the first start pulse, so the output signal $ST_8$, the signal obtained by inverting the output signal $ST_9$, and the first enable signal $EN_1$, are at high level in period $T_1$ as well.

Accordingly, if the (8, 1)'th NAND circuit 113 were to operate based only on the output signal $ST_8$, a signal obtained by inverting the output signal $ST_9$, and the first enable signal $EN_1$, trouble would occur in that a scanning signal would be supplied to the scanning line $SCL_{14}$ not only in the period $T_{17}$ in which the scanning signal should be generated, but also in the period $T_1$.

In the first embodiment, the operations of the NAND circuit 113 are restricted based on the period identifying signal SP, so trouble where a scanning signal is supplied in the period $T_1$ does not occur. That is to say, the period identifying signal SP is directly input to the input side of the (8, 1)'th NAND circuit 113, as a signal based on the period identifying signal SP, as described above. In period $T_1$, the period identifying signal SP is at a low level. Accordingly, in period $T_1$ the operations of the NAND circuit 113 are restricted, and do not generate a scanning signal. On the other hand, in period $T_{17}$, the period identifying signal SP is at a high level. Accordingly, the (8, 1)'th NAND circuit 113 generates a scanning signal based only on a portion of the output signal $ST_8$ corresponding to the first start pulse, a signal obtained by inverting the output signal $ST_9$, and the first enable signal $EN_1$.

Let us also consider the (9, 1)'th NAND circuit 113. Signals based on the scanning signals from the (9, 1)'th NAND circuit 113 are supplied to the scanning line $SCL_{16}$ shown in FIG. 1. A signal based on the period identifying signal SP, the output signal $ST_9$, the signal obtained by inverting the output signal $ST_{10}$, and the first enable signal $EN_1$, are applied to the input side of the (9, 1)'th NAND circuit 113. Unlike the case of the (8, 1)'th NAND circuit 113, a period identifying signal SP inverted by the NOR circuit 116 is input to the input side of the (9, 1)'th NAND circuit 113 as a signal based on the period identifying signal SP.

As shown in FIG. 5, in the period $T_{19}$ in which the scanning signal should be generated, the output signal $ST_9$, the signal obtained by inverting the output signal $ST_{10}$, and the first enable signal $EN_1$, are at high level. However, the first stage shift register $SR_1$ has also received input of the second start pulse in addition to the first start pulse, so the output signal $ST_9$, the signal obtained by inverting the output signal $ST_{10}$, and the first enable signal $EN_1$, are at high level in period $T_3$ as well. As described above, a period identifying signal SP inverted by the NOR circuit 116 is input to the input side of the (9, 1)'th NAND circuit 113. In period $T_3$, the period identifying signal SP is at a high level, so in period $T_3$ the (9, 1)'th NAND circuit 113 does not generate a scanning signal. On the other hand, in period $T_{19}$, the period identifying signal SP is at a low level, so the (9, 1)'th NAND circuit 113 generates a scanning signal in period $T_{19}$.

While description has been made regarding the operations of the (8, 1)'th NAND circuit 113 and the (9, 1)'th NAND circuit 113, the operations are the same for the other NAND circuits 113 as well. The (p', q)'th NAND circuit 113 generates a scanning signal based only on a portion of the output signal $ST_p$ corresponding to the first start pulse, the signal obtained by inverting the output signal $ST_{p'+1}$, and the q'th enable signal $EN_q$.

Description of the display device 1 will continue. As shown in FIG. 1, signals of the (1, 2)'th NAND circuit 113 are supplied to the scanning line $SCL_1$ connected to the first row of display elements 10, and signals of the (2, 1)'th NAND circuit 113 are supplied to the scanning line $SCL_2$ connected to the second row of display elements 10. This is true for the other scanning line SCL as well. That is to say, signals of the (p', q)'th NAND circuit 113 (excluding a case wherein p'=1 and q=1) are supplied to the scanning line $SCL_m$ connected to the m'th (where m=Q×(p'−1)+q−1) row of display elements 10.

The display elements 10 to which signals based on the scanning signals from the (p', q)'th NAND circuit 113 are supplied via the scanning line $SCL_m$ are supplied with signals based on scanning signals from the (p'−1, q')'th NAND circuit 113 (where q' is a natural number from 1 through Q, hereinafter the same) in the event that q=1, and signals based on scanning signals from the (p', q'')'th NAND circuit 113 (where q'' is a natural number from 1 through (q−1), hereinafter the same) in the event that q>1, via the initialization control line $AZ_m$ connected to the display elements 10.

More specifically, in the first embodiment, the display elements 10 to which signals based on the scanning signals from the (p', q)'th NAND circuit 113 are supplied via the scanning line $SCL_m$, are supplied with signals based on scanning signals from the (p'−1, Q)'th NAND circuit 113 in the event that q=1, and signals based on scanning signals from the (p', q−1)'th NAND circuit 113 in the event that q>1, via the initialization control line $AZ_m$ connected to the display elements 10.

Also, the display control line $CL_m$ connected to the display elements 10 is supplied with signals based on the output signal $ST_{p'+1}$ from the (p'+1)'th stage shift register $SR_{p'+1}$ in the case that q=1, and is supplied with signals based on the output signal $ST_{p'+2}$ from the (p'+2)'th stage shift register $SR_{p'+2}$ in the case that q>1. Note that the third transistor $TR_3$ and fourth transistor $TR_4$ shown in FIG. 6 are p-channel type transistors, so signals are supplied to the display control line $CL_m$ via the NOR circuit 115.

Description will be made in further detail with reference to FIG. 1. For example, looking at the display elements 10 to which signals based on the scanning signals from the (8', 1)'th NAND circuit 113 are supplied via the scanning line $SCL_{14}$, the initialization control line $AZ_{14}$ connected to the display element 10 is supplied with signals based on the scanning signals from the (7', 2)'th NAND circuit 113. Signals based on the output signal $ST_9$ from the ninth stage shift register $SR_9$ are supplied to the display control line $CL_{14}$ connected to the display element 10. Also, looking at the display elements 10 to which signals based on the scanning signals from the (8', 2)'th NAND circuit 113 are supplied via the scanning line $SCL_{15}$, the initialization control line $AZ_{15}$ connected to the display element 10 is supplied with signals based on the scanning signals from the (8', 1)'th NAND circuit 113. Signals based on the output signal $ST_{10}$ from the tenth stage shift register $SR_{10}$ are supplied to the display control line $CL_{15}$ connected to the display element 10.

Next, operation of the display device 1 will be described regarding operations of a display element 10 at the m'th row and n'th column, to which signals of the (p', q)'th NAND circuit 113 are supplied from the scanning line $SCL_m$. This display element 10 will hereinafter be referred to as "(n, m)'th display element 10" or "(n, m)'th sub-pixel". Also, the horizontal scanning period of the display elements 10 arrayed on the m'th row (more specifically, the m'th horizontal scanning period of the current display frame) will be referred to simply as "m'th horizontal scanning period". This will be the same for the other embodiments described later, as well.

Figure 8:
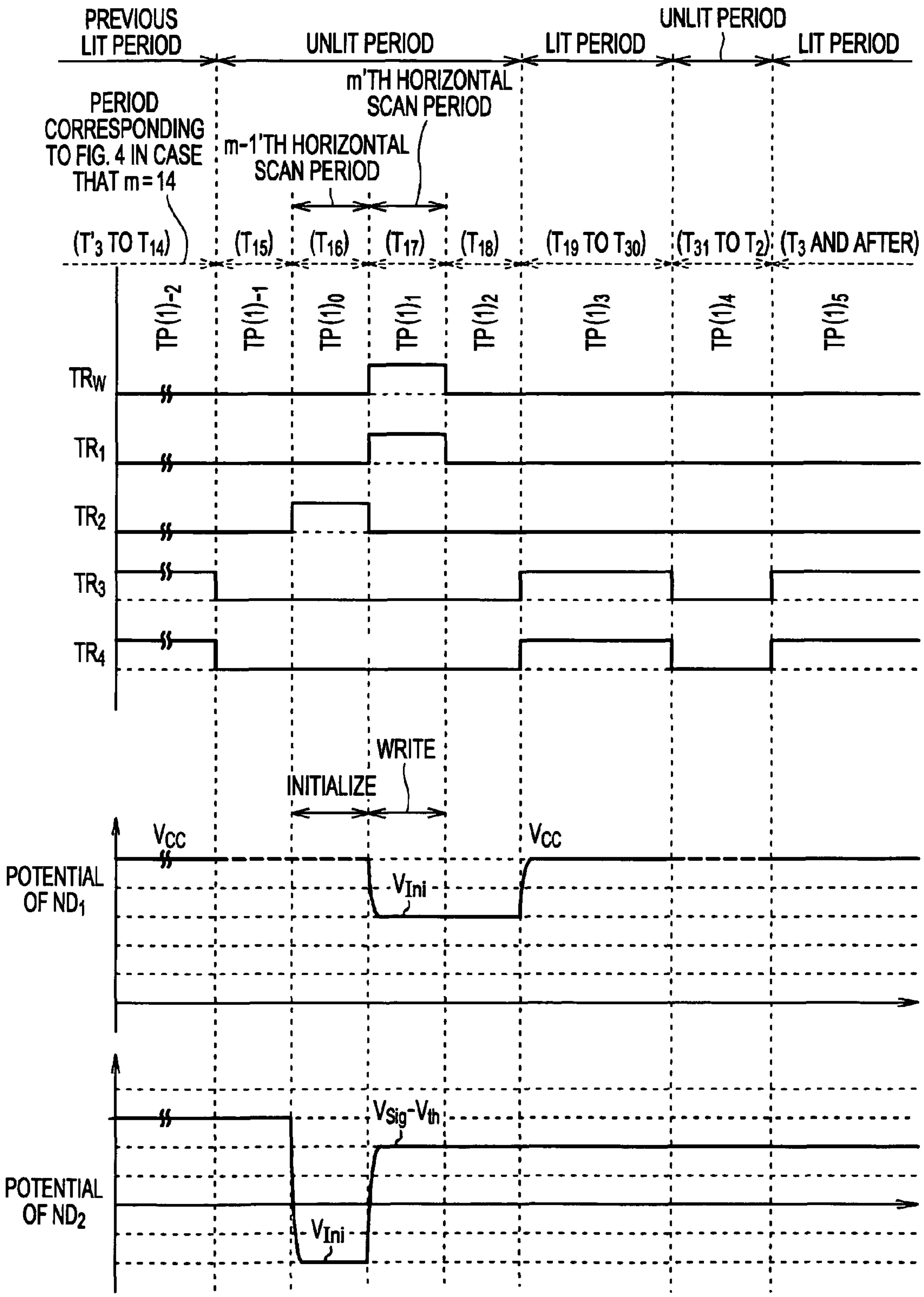
FIG. 8 is a schematic driving timing chart of a display element at the m'th row and n'th column.
Figure 9A:
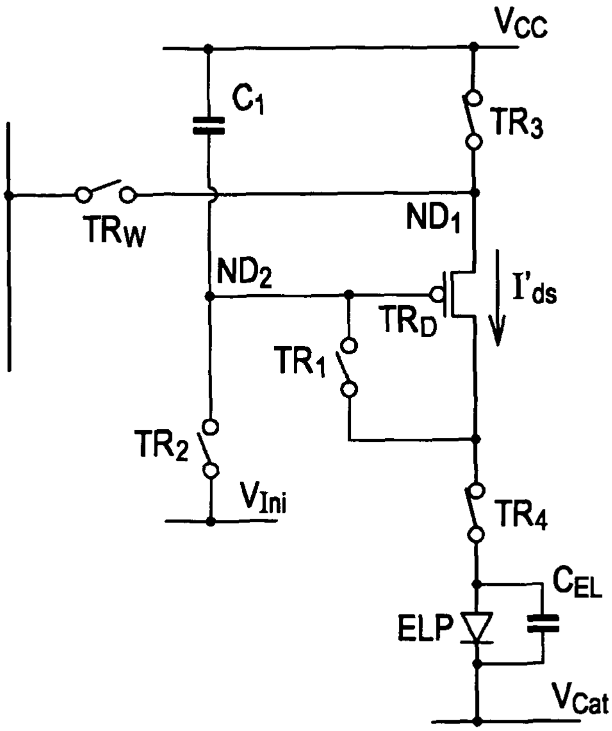
FIGS. 9A and 9B are diagrams schematically illustrating the on/off states of the transistors in the driving circuit making up the display element at the m'th row and n'th column.
Figure 9B:
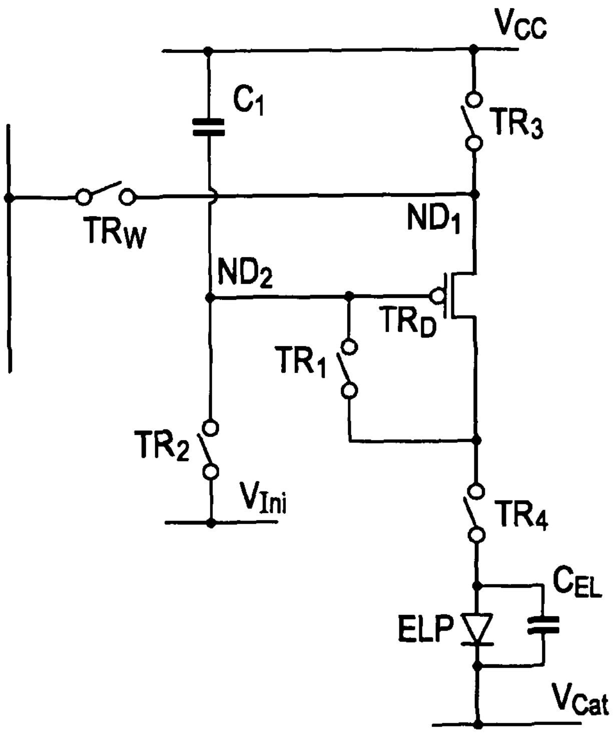
Figure 10A:
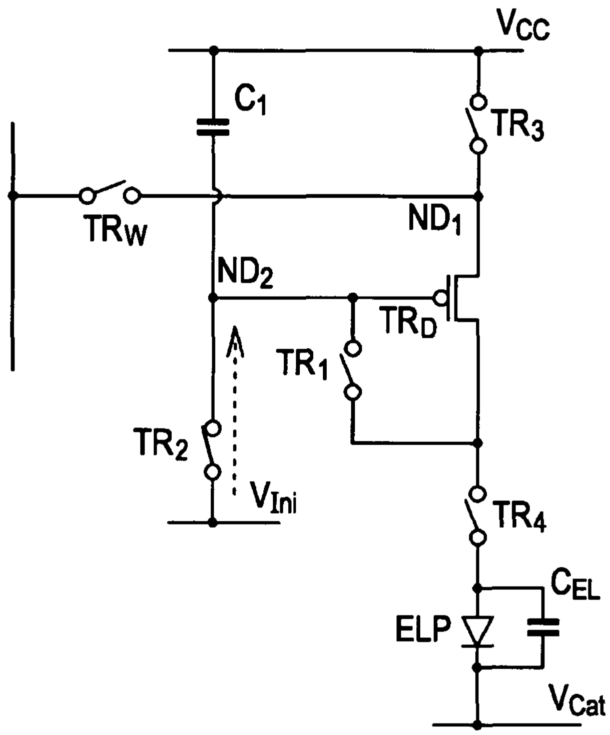
FIGS. 10A and 10B are diagrams continuing from FIGS. 9A and 9B, schematically illustrating the on/off states of the transistors in the driving circuit making up the display element at the m'th row and n'th column.
Figure 10B:
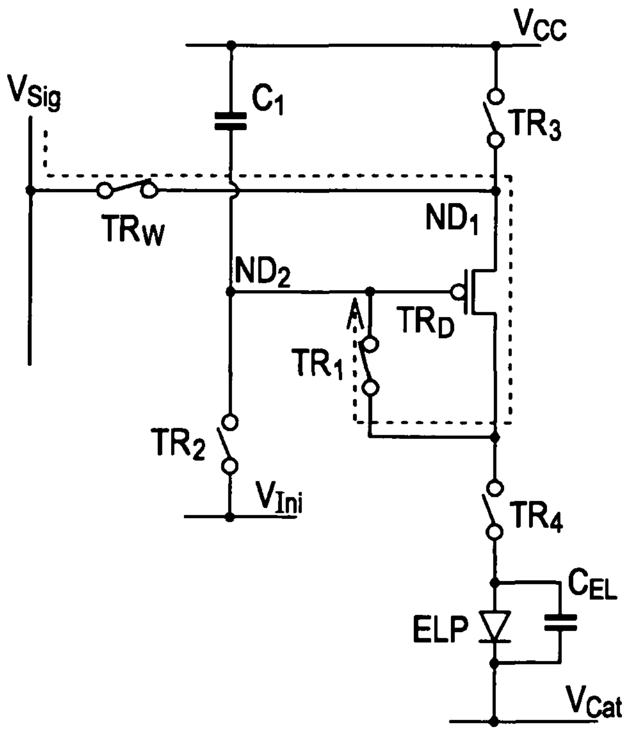
Figure 11A:
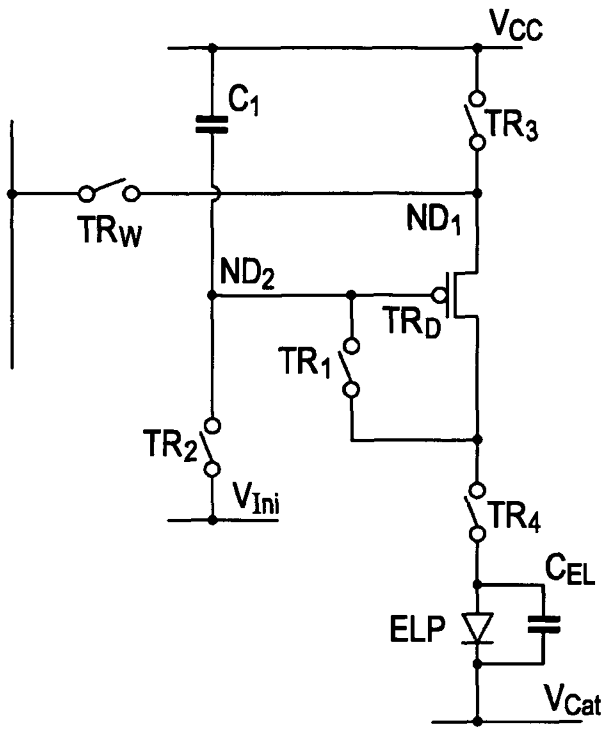
FIGS. 11A and 11B are diagrams continuing from FIGS. 10A and 10B, schematically illustrating the on/off states of the transistors in the driving circuit making up the display element at the m'th row and n'th column.
Figure 11B:
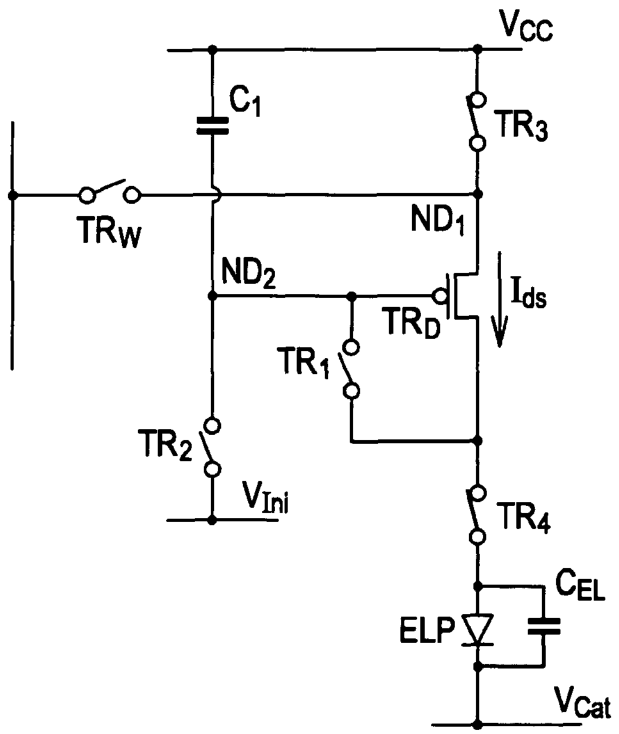
Figure 12A:
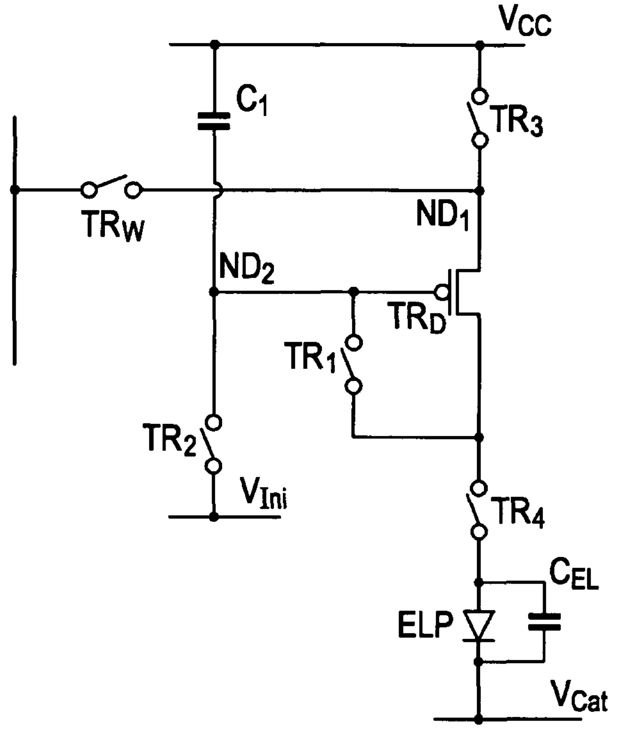
FIGS. 12A and 12B are diagrams continuing from FIGS. 11A and 11B, schematically illustrating the on/off states of the transistors in the driving circuit making up the display element at the m'th row and n'th column.
Figure 12B:
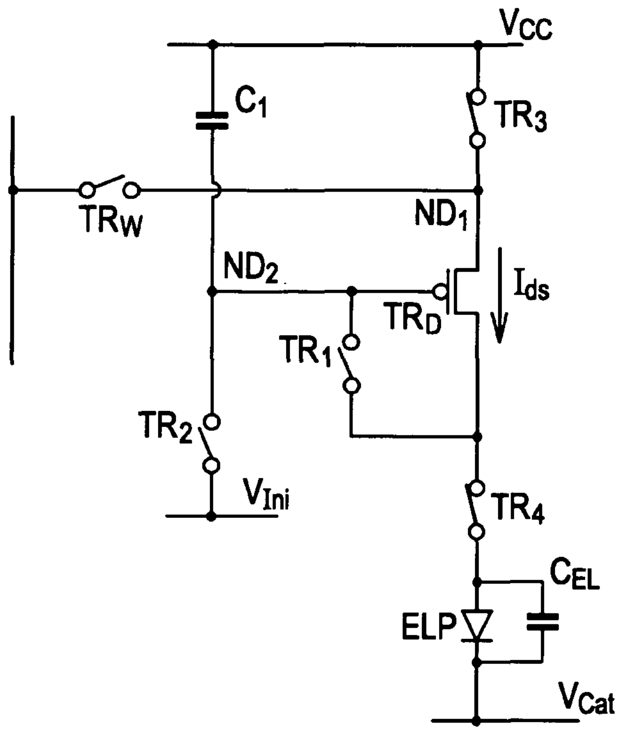

FIG. 8 is a schematic driving timing chart of the display element 10 at the m'th row and n'th column. Also, FIGS. 9A and 9B are diagrams schematically illustrating the on/off states of the transistors in the driving circuit 11 making up the display element 10 at the m'th row and n'th column. FIGS. 10A and 10B are diagrams continuing from FIGS. 9A and 9B, schematically illustrating the on/off states of the transistors in the driving circuit 11 making up the display element 10 at the m'th row and n'th column. FIGS. 11A and 11B are diagrams continuing from FIGS. 10A and 10B, schematically illustrating the on/off states of the transistors in the driving circuit 11 making up the display element 10 at the m'th row and n'th column. FIGS. 12A and 12B are diagrams continuing from FIGS. 11A and 11B, schematically illustrating the on/off states of the transistors in the driving circuit 11 making up the display element 10 at the m'th row and n'th column.

Note that, for the sake of facilitating description, p'=8 and q=1, and m=14, when comparing the timing chart in FIG. 8 with FIGS. 3 through 5. Specifically, the timing chart of initialization control line $AZ_{14}$, scanning line $SCL_{14}$, and display control line $CL_{14}$ in FIG. 4 is to be referred to.

In the lit state of the display element 10, the driving transistor $TR_D$ is driven so as to apply drain current $I_{ds}$ in accordance with the following Expression (1). In the lit state of the display element 10, the one source/drain region of the driving transistor $TR_D$ acts as a source region, and the other source/drain region acts as a drain region. To facilitate description, in the following description, the one source/drain region of the driving transistor $TR_D$ may be referred to simply as "source region", and the other source/drain region simply as "drain region". We will also say that μ effective mobility, L channel length, W channel width, $V_{gs}$ voltage difference between the source region and gate region, and $C_{OX}$ (relative permittivity of gate insulation layer)×(permittivity of vacuum)/(thickness of gate insulation layer).

$$I_{ds}=k\cdot\mu\cdot(V_{gs}-V_{th})^2 \quad (1)$$

Also, while the following voltage and potential values will be used in the first embodiment and later-described other embodiments, these are only values for explanatory purposes, and the present invention is not restricted to these values.

$V_{Sig}$ Video signal for controlling the luminance at the light emitting unit ELP 0 volts (maximum luminance) to 8 volts (minimum luminance)

$V_{CC}$ Driving voltage 10 volts $V_{Ini}$ Initialization voltage for initializing the potential of the second node $ND_2$ −4 volts $V_{th}$ Threshold voltage of driving transistor $TR_D$
2 volts $V_{Cat}$ Voltage applied to power supply line $PS_2$
−10 volts Period TP(1)$_{-2}$ (See FIGS. 8A through 9A)

The Period TP(1)$_{-2}$ is a period in which the (n, m)'th display element 10 is in a lit state, in accordance with the video signal $V'_{Sig}$ written thereto earlier. For example, in the case of m=14, the Period TP(1)$_{-2}$ corresponds to the period from the start of the period $T'_3$ (period corresponding to period $T_3$ shown in FIG. 4 in the preceding frame) to the end of the period $T_{14}$. The initialization control line $AZ_{14}$ and scanning line $SCL_{14}$ are at the high level, and the display control line $CL_{14}$ is at the low level.

Accordingly, the write transistor $TR_W$, first transistor $TR_1$, and second transistor $TR_2$ are in an off state. The third transistor $TR_3$ and fourth transistor $TR_4$ are in an on state. The light emitting unit ELP at the display element 10 making up the (n, m)'th display element 10 has applied thereto a drain current $I'_{ds}$ based on a later-described Expression (5), and the luminance of the display element 10 configuring the (n, m)'th sub-pixels is a value corresponding to this drain current $I'_{ds}$.

Period TP(1)$_{-1}$ (See FIGS. 8A, 8B, and 9B)

The (n, m)'th display element 10 is in an unlit state from this Period TP(1)$_{-1}$ is to a later-described Period TP(1)$_2$. For example, in the case of m=14, the Period TP(1)$_{-1}$ corresponds to the period $T'_{15}$ in FIG. 4. The initialization control line $AZ_{14}$ and scanning line $SCL_{14}$ maintain the high level, and the display control line $CL_{14}$ goes to the high level.

Accordingly, the write transistor $TR_W$, first transistor $TR_1$, and second transistor $TR_2$ maintain the off state. The third transistor $TR_3$ and fourth transistor $TR_4$ go from the on state to the off state. Thus, the first node $ND_1$ is in a state of being cut off from the power supply line $PS_1$, and further, the light emitting unit ELP and driving transistor $TR_D$ are in a state of being cut off. Accordingly, current does not flow to the light emitting unit ELP, which is accordingly in an off state.

Period TP(1)$_0$ (See FIGS. 8A, 8B, and 10A)

The Period TP(1)$_0$ is the (m−1)'th horizontal scanning period in the current display frame. For example, in the case of m=14, the Period TP(1)$_0$ corresponds to the period $T_{16}$ in FIG. 4. The scanning line $SCL_{14}$ and the display control line $CL_{14}$ maintain the high level. The initialization control line $AZ_{14}$ goes to the low level, and then goes to the high level at the end of the period $T_{16}$.

In this Period TP(1)$_0$, the first switch circuit unit $SW_1$, third switch circuit unit $SW_3$, and fourth switch circuit unit $SW_4$ maintain the off state, and following applying the predetermined initialization voltage $V_{Ini}$ from the power supply line $PS_3$ to the second node $ND_2$ via the second switch circuit unit $SW_2$ placed in the on state, the second switch circuit unit $SW_2$ is set to an off state, thereby performing an initialization process for setting the potential of the second node $ND_2$ to the predetermined reference potential.

That is to say, the write transistor $TR_W$, first transistor $TR_1$, third transistor $TR_3$, and fourth transistor $TR_4$ are in an off state. The second transistor $TR_2$ goes from an off state to an on state, and the predetermined initialization voltage $V_{Ini}$ is applied from the power supply line $PS_3$ via the second transistor $TR_2$ placed in the on state. At the end of the Period TP(1)$_0$, the second transistor $TR_2$ goes to the off state. The driving voltage $V_{CC}$ is applied to one end of the capacitance unit $C_1$ such that the potential at the one end of the capacitance unit $C_1$ is in a maintained state, so the potential of the second node $ND_2$ is set to the predetermined reference voltage (−4 volts) by the initialization voltage $V_{Ini}$.

Period TP(1)$_1$ (See FIGS. 8A, 8B, and 10B)

The Period TP(1)$_1$ is the m'th horizontal scanning period in the current display frame. For example, in the case of m=14, the Period TP(1)$_1$ corresponds to the period $T_{17}$ in FIG. 4. The initialization control line $AZ_{14}$ and the display control line $CL_{14}$ are at the high level, and the scanning line $SCL_{14}$ goes to the low level.

In this Period TP(1)$_1$, the second switch circuit unit $SW_2$, third switch circuit unit $SW_3$, and fourth switch circuit unit $SW_4$ maintain the off state, the first switch circuit unit $SW_1$ is placed in an on state, and in a state wherein the second node $ND_2$ and the other source/drain region of the driving transistor $TR_D$ are electrically connected by the first switch circuit unit $SW_1$ in the on state, the video signal $V_{Sig}$ is applied from the data line $DTL_n$ to the first node $ND_1$ via the write transistor $TR_W$ placed in the on state by the signals from the scanning line $SCL_m$, thereby performing a writing process for changing the potential of the second node $ND_2$ toward a potential which can be calculated by subtracting the threshold voltage $V_{th}$ of the driving transistor $TR_D$ from the video signal $V_{Sig}$.

That is to say, the off state of the second transistor $TR_2$, third transistor $TR_3$, and fourth transistor $TR_4$ is maintained. The write transistor $TR_W$ and first transistor $TR_1$ are placed in an one state by signals from the scanning line $SCL_m$. The second node $ND_2$ and the other source/drain region of the driving transistor $TR_D$ are placed in an electrically connected state via the first transistor $TR_1$ in the on state. Also, the video signal $V_{Sig}$ is applied from the data line $DTL_n$ to the first node $ND_1$ via the write transistor $TR_W$ which has been placed in the on state by the signal from the scanning line $SCL_m$. Accordingly, the potential of the second node $ND_2$ changes toward a potential which can be calculated by subtracting the threshold voltage $V_{th}$ of the driving transistor $TR_D$ from the video signal $V_{Sig}$.

That is to say, due to the above-described initialization process, the potential of the second node $ND_2$ is initialized such that the driving transistor $TR_D$ is in an on state at the start of the Period TP(1)$_1$, so the potential of the second node $ND_2$ changes toward the potential of the video signal $V_{Sig}$ applied to the first node $ND_1$. However, upon the potential difference between the gate electrode of the driving transistor $TR_D$ and the one source/drain region reaching the threshold voltage $V_{th}$, the driving transistor $TR_D$ goes to an off state. In this state, the potential of the second node $ND_2$ is approximately $(V_{Sig}-V_{th})$. The voltage $V_{ND2}$ of the second node $ND_2$ is as expressed in the following Expression (2). Before the (m+1)'th horizontal scanning period starts, the write transistor $TR_W$ and first transistor $TR_1$ are placed in an off state by signals from the scanning line $SCL_m$.

$$V_{ND2} \approx (V_{Sig}-V_{th}) \tag{2}$$

Period TP(1)$_2$ (See FIGS. 8A, 8B, 11A)

The Period TP(1)$_2$ is a period up to the emitting period starting following the writing process, and the (n, m)'th display element 10 is in an unlit state. For example, in the case of m=14, the Period TP(1)$_2$ corresponds to the period $T_{18}$ in FIG. 4. The scanning line $SCL_{14}$ goes to the high level, and the initialization control line $AZ_{14}$ and display control line $CL_{14}$ maintain the high level.

Accordingly, the write transistor $TR_W$ and first transistor $TR_1$ go to an off state, and the second transistor $TR_2$, third transistor $TR_3$, and fourth transistor $TR_4$ maintain the off state. The first node $ND_1$ maintains the state of being cut off from the power supply line $PS_1$, and the light emitting unit ELP and driving transistor $TR_D$ maintain the state of being cut off. The potential $V_{ND2}$ of the second node $ND_2$ maintains the above Expression (2) due to the capacitance unit $C_1$.

Period TP(1)$_3$ (See FIGS. 8A, 8B, 11B)

In this Period TP(1)$_3$, the first switch circuit unit $SW_1$ and second switch circuit unit $SW_2$ maintain the off state, the other source/drain region of the driving transistor $TR_D$ and the one end of the light emitting unit ELP are electrically connected via the fourth switch circuit unit $SW_4$ placed in an on state, the predetermined driving voltage $V_{CC}$ is applied to the first node $ND_1$ from the power supply line $PS_1$ via the third switch circuit unit $SW_3$ placed on the on state, thereby performing an emitting process for driving the light emitting unit ELP by applying current to the light emitting unit ELP via the driving transistor $TR_D$.

For example, in the case of m=14, the Period TP(1)$_3$ corresponds to the period from the start of period $T_{19}$ to the end of period $T_{30}$ in FIG. 4. The initialization control line $AZ_{14}$ and scanning line $SCL_{14}$ maintain the high level and the display control line $CL_{14}$ goes to the low level.

That is to say, the first transistor $TR_1$ and second transistor $TR_2$ maintain the off state, and the third transistor $TR_3$ and fourth transistor $TR_4$ go from the off state to the on state due to signals from the display control line $CL_m$. The predetermined driving voltage $V_{CC}$ is applied to the first node $ND_1$ via the third transistor $TR_3$ placed in the on state. Also, the other source/drain region of the driving transistor $TR_D$ and the one end of the light emitting unit ELP are electrically connected via the fourth transistor $TR_4$ which has been placed in the on state. Thus, the light emitting unit ELP is driven by current being applied to the light emitting unit ELP via the driving transistor $TR_D$.

Based on Expression (2), $$V_{gs} \approx V_{CC} - (V_{Sig} - V_{th})$$

holds, so Expression (1) can be rewritten as follows.

$$\begin{aligned} I_{ds} &= k \cdot \mu \cdot (V_{gs} - V_{th})^2 \\ &= k \cdot \mu \cdot (V_{CC} - V_{Sig})^2 \end{aligned} \tag{4}$$

Accordingly, the current $I_{ds}$ of the light emitting unit ELP is proportionate to the value of the potential difference between $V_{CC}$ and $V_{Sig}$ squared. In other words, the current $I_{ds}$ flowing through the light emitting unit ELP is not dependent on the threshold voltage $V_{th}$ of the driving transistor $TR_D$, meaning that the amount of emission (luminance) of the light emitting unit ELP is not affected by the threshold voltage $V_{th}$ of the driving transistor $TR_D$. The luminance of the (n, m)'th display element 10 is a value corresponding to this $I_{ds}$.

Period TP(1)$_4$ (See FIGS. 8A, 8B, 12A)

In the case of m=14 for example, this Period TP(1)$_4$ is the period between the end of the second start pulse in the output signal $ST_9$ (the end of the period $T_{30}$ in FIG. 4) and immediately before the leading edge of the first start pulse in the next frame (the end of the period $T_2$ in the next frame in FIG. 4). At the start of this period, the output signal $ST_9$ goes from the high level to the low level. The display control line $CL_8$ goes from the low level to the high level. The initialization control line $AZ_8$ and scanning line $SCL_8$ maintain the high level.

Accordingly, the third transistor $TR_3$ and fourth transistor $TR_4$ go from the on state to the off state. The write transistor $TR_W$, first transistor $TR_1$, and second transistor $TR_2$ maintain the off state. Accordingly, the first node $ND_1$ is cut off from the power supply line $PS_1$, and further, the light emitting unit ELP and driving transistor $TR_D$ are in a cut off state. Thus, no current flows to the light emitting unit ELP, which is accordingly in an unlit state.

Period TP(1)$_5$ (See FIGS. 8A, 8B, 12B)

In the case of m=14 for example, this Period TP(1)$_5$ is the period after the start of the first start pulse in the next frame (the start of the period $T_3$ in the next frame in FIG. 4). In this period, the output signal $ST_9$ goes from the low level to the high level. The display control line $CL_8$ goes from the high level to the low level. The initialization control line $AZ_8$ and scanning line $SCL_8$ maintain the high level.

Accordingly, the third transistor $TR_3$ and fourth transistor $TR_4$ go from the off state to the on state. The write transistor $TR_W$, first transistor $TR_1$, and second transistor $TR_2$ maintain the off state. Accordingly, the first node $ND_1$ and the power supply line $PS_1$ are reconnected, and the light emitting unit ELP and driving transistor $TR_D$ are also reconnected. Thus, current flows to the light emitting unit ELP, which is accordingly in lit state again.

The lit state of the light emitting unit ELP continues to a period equivalent to the end of the Period TP(1)$_{-2}$ of the next frame. Thus, the operations of emission of the display element 10 configuring the (n, m)'th sub-pixels are completed.

The length of the until period is the same, regardless of the value of m. However, the ratio of the Period TP(1)$_{-1}$ and Period TP(1)$_2$ making up the unlit periods change depending on the value of m. This holds true in the later-described other embodiments as well. For example, in the timing chart for scanning line $SCL_{15}$ in FIG. 4, there is no Period TP(1)$_{-1}$. Note that the absence of the Period TP(1)$_{-1}$ does not pose any problem in particular to operations of the display device.

The scan driving circuit 110 according to the first example is an integrated circuit of a structure where signals are supplied to the scanning lines SCL, initialization control line AZ, and display control line CL. Accordingly, reduction in layout area of the circuits, and reduction of circuit costs can be realized. Also, with the display device 1 according to the first embodiment, the lit/unlit state of the display elements 10 can be switched multiple times in one field period by a simple arrangement of changing the number of start pulses input to the first stage shift register making up the scan driving circuit 110, thereby reducing flickering of the image displayed on the display device.

Figure 13:
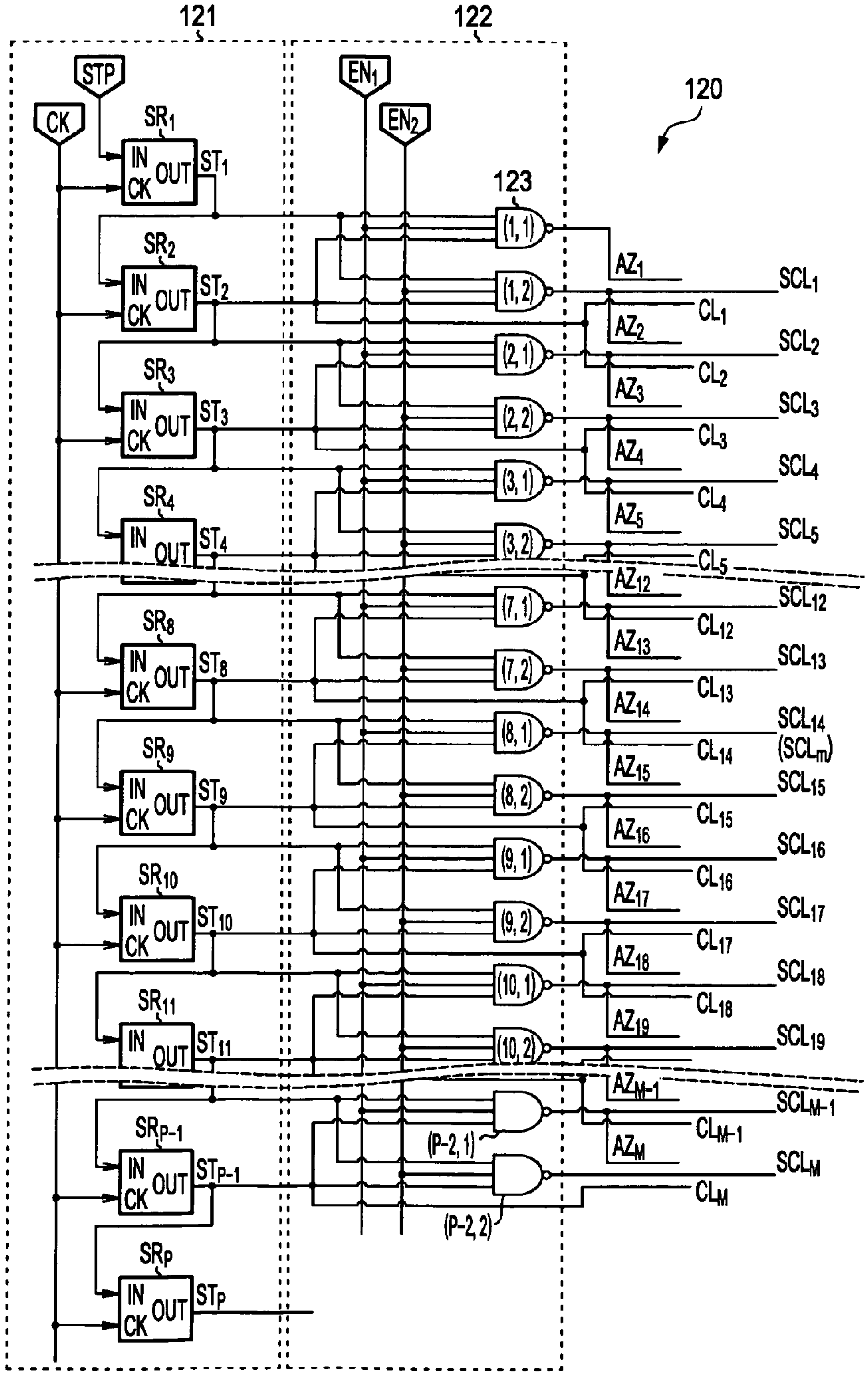
FIG. 13 is a circuit diagram of a scan driving circuit according to a comparative example.

Description will further be made with comparison to a comparative example. FIG. 13 is a circuit diagram of a scan driving circuit 120 according to a comparative example. In the scan driving circuit 120, the configuration of a logic circuit unit 122 differs from the logic circuit unit 112 of the scan driving circuit 110 according to the first embodiment. The configuration of the shift register unit 121 of the scan driving circuit 120 is the same as the shift register unit 111 of the scan driving circuit 110.

More specifically, with the scan driving circuit 120, the period identifying signal SP has been omitted, and further, the NOR circuits 114 and 115 shown in FIG. 1 have been omitted. Also, at the display element 10 to which signals based on scanning signals from a (p', q)'th NAND circuit 123 are supplied via the scanning line SCL, signals based on the output signal $ST_{p'}$ from the (p')'th shift register $SR_{p'}$ are supplied in the case of q=1, and signals based on the output signal $ST_{p'+1}$ from the p'+1'th shift register $SR_{p'+1}$ are supplied in the case of q>1, from the display control line CL connected to the display element 10.

With the scan driving circuit 120 of the configuration described above, the (p', q)'th NAND circuit 123 generates scanning signals based on the output signal $ST_p$, output signal $ST_{p'+1}$, and the q'th enable signal $EN_q$. Accordingly, in the event that there are multiple q'th enable signals $EN_q$ in the overlapping period of the start pulse of output signal $ST_p$, and the start pulse of output signal $ST_{p+1}$, multiple scan signals will be generated in the overlapping period. Accordingly, if the start pulse STP is to have a leading edge between the start of the period $T_1$ and the end thereof, settings have to be made such that the trailing edge of the start pulse $SR_p$ is between the start and end of the period $T_5$. The scan driving circuit 110 according to the first embodiment does not have such restrictions.

Figure 14:
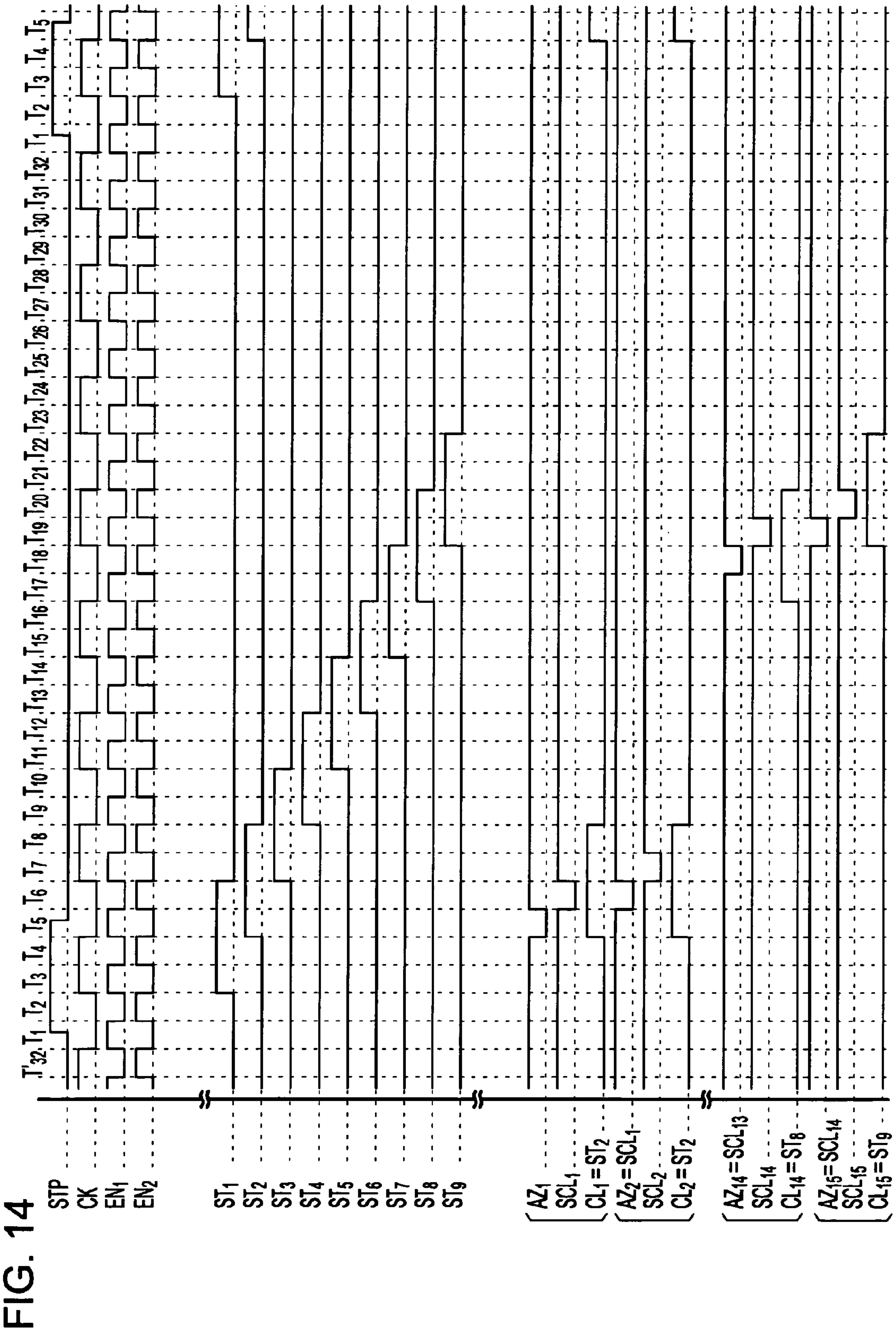
FIG. 14 is a timing chart of the scan driving circuit shown in FIG. 13 regarding the leading edges of start pulses between the start and end of a period $T_1$ and trailing edges of start pulses between the start and end of a period $T_5$.

FIG. 14 is a timing chart of the scan driving circuit 120 shown in FIG. 13 where the start pulse STP has a leading edge between the start and end of the period $T_1$, and a trailing edge between the start and end of the period $T_5$. As can be clearly seen in comparison with the timing chart in FIG. 4, similar signals as with the case in FIG. 4 are supplied to the initialization control line AZ and scanning line SCL, albeit there be phase shifting.

Figure 15:
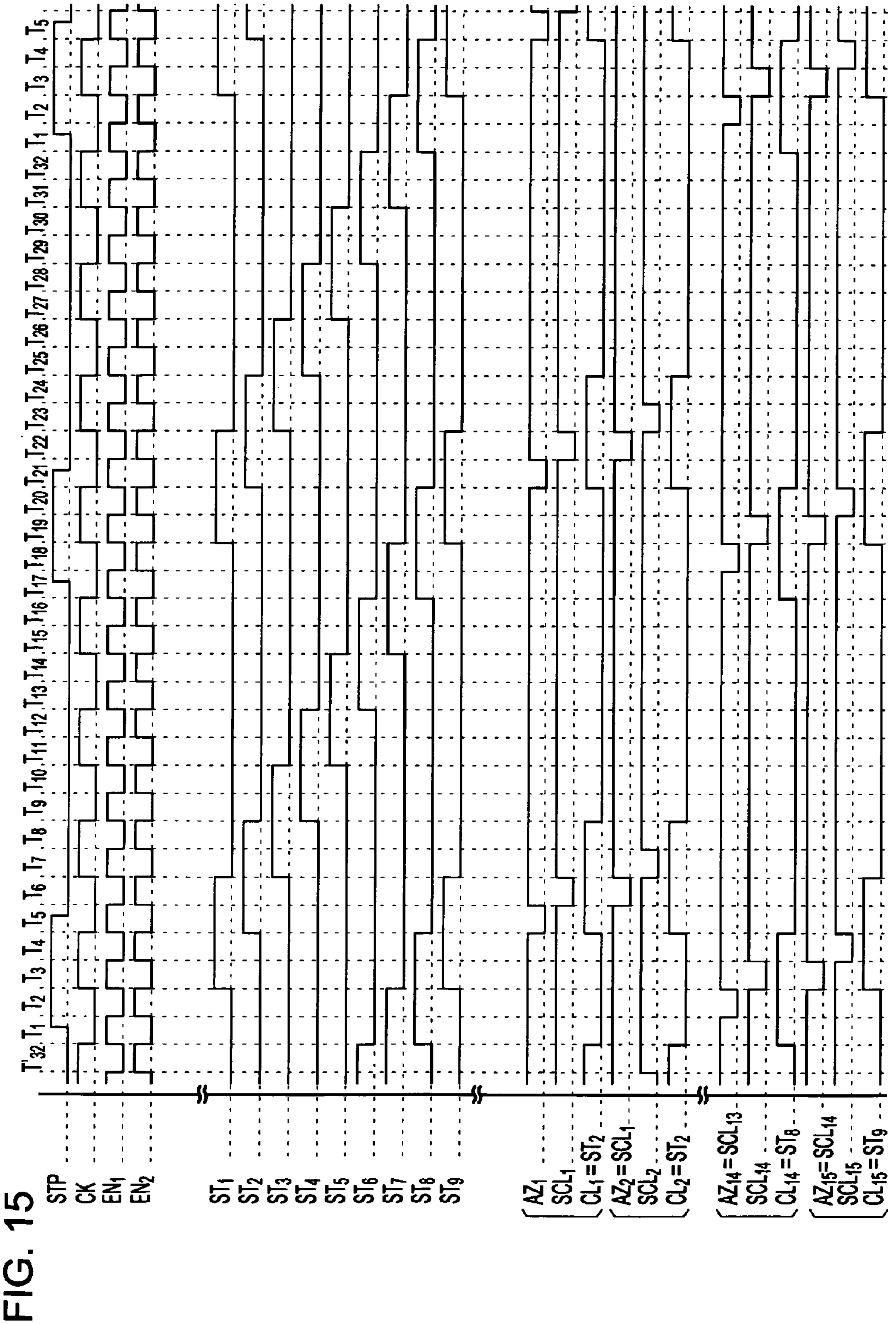
FIG. 15 is a timing chart illustrating a case at the scan driving circuit according to the comparative example wherein a first start pulse and a second start pulse have been input to a first stage shift register during a period equivalent to one field period.

FIG. 15 is a timing chart regarding the scan driving circuit 120 according to the comparative example, where the first start pulse and second start pulse are input to the first stage shift register $SR_1$ within a period equivalent to one field period. In this case, multiple scanning signals are generated within one field period. Accordingly, with the scan driving circuit 120 according to the comparative example, there are restrictions that only one start pulse can be input to the first stage shift register $SR_1$, and also there are restrictions regarding the end thereof, as well. The scan driving circuit 110 according to the first embodiment has no such restrictions.

Second Embodiment

The second embodiment also relates to a scan driving circuit and to a display device having the scan driving circuit. As shown in FIG. 2, the display device 2 is of the same configuration as the display device 1 according to the first embodiment, other than the scan driving circuit being different. Accordingly, description of the display device 2 according to the second embodiment will be omitted.

Figure 16:
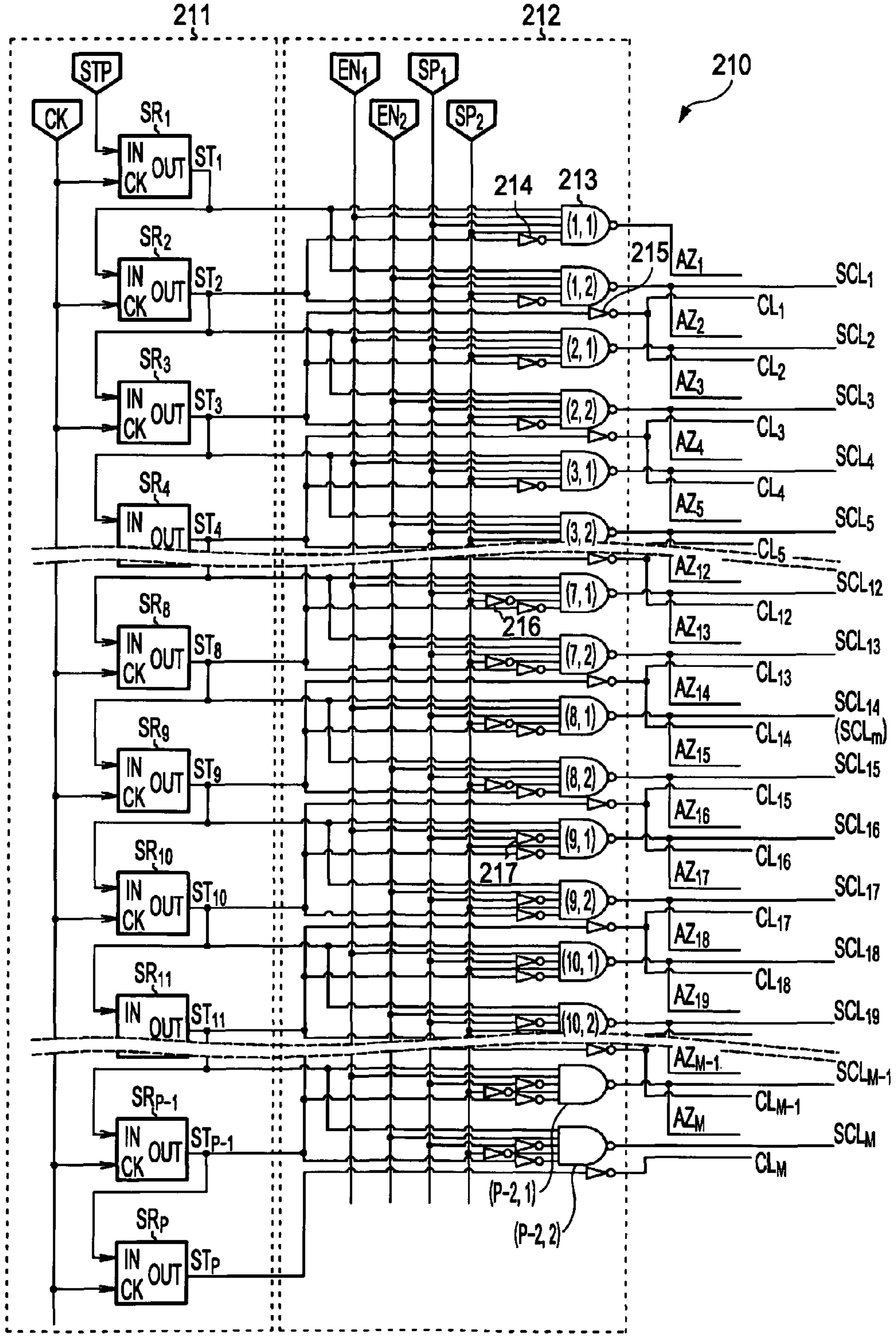
FIG. 16 is a circuit diagram of a scan driving circuit according to a second embodiment.
Figure 17:
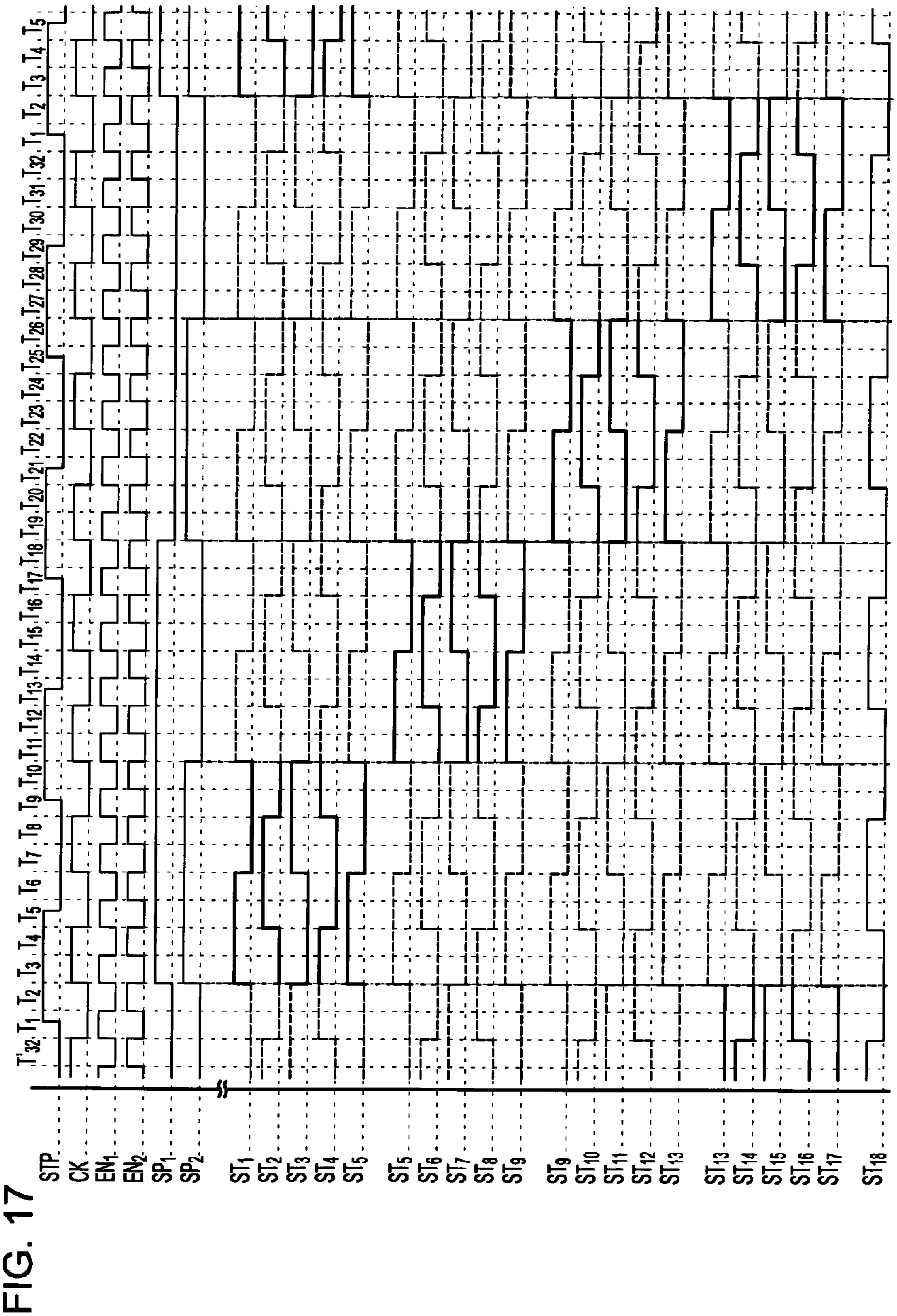
FIG. 17 is a schematic timing chart of a shift register unit making up the scan driving circuit shown in FIG. 16.
Figure 18:
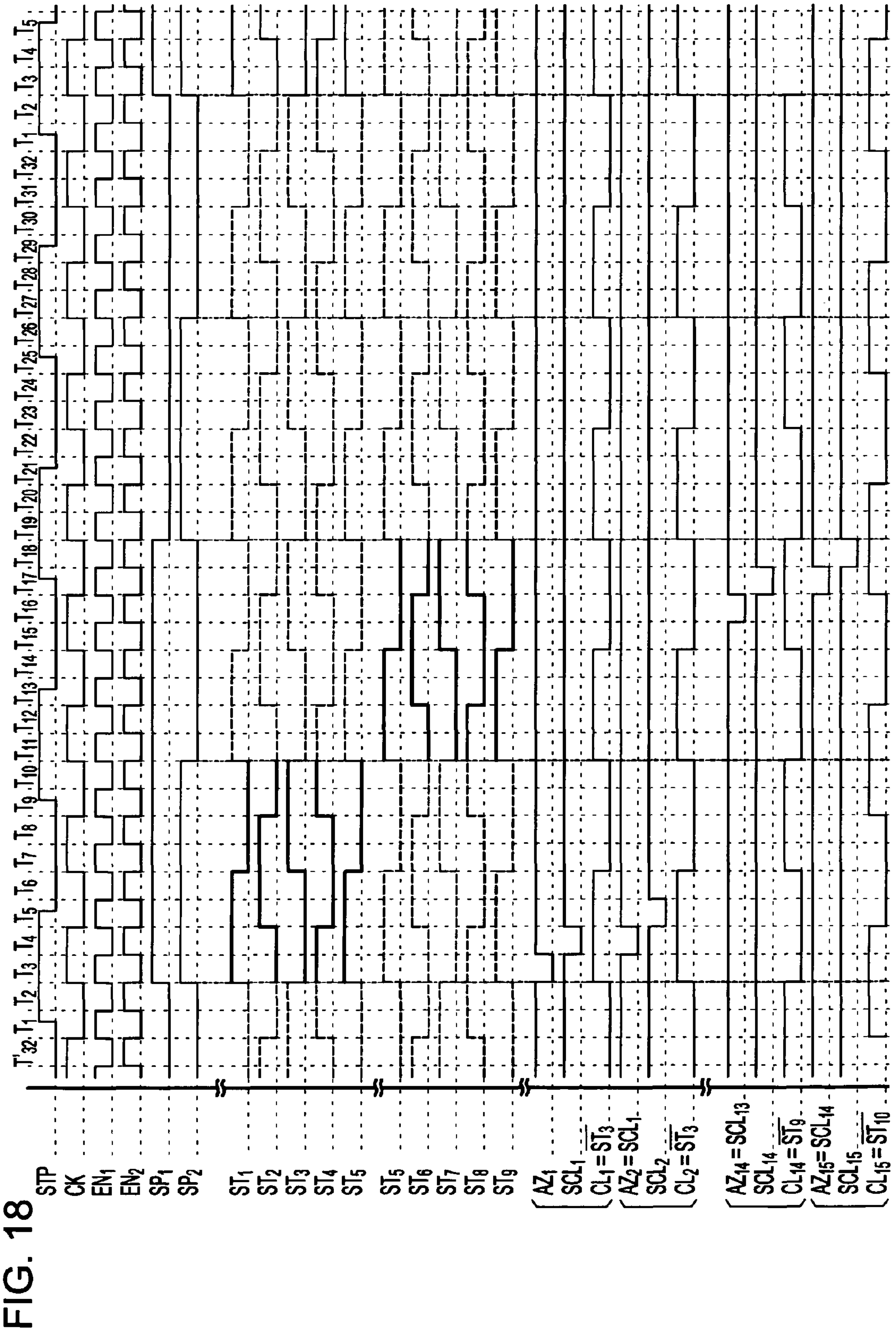
FIG. 18 is a schematic timing chart of an upstream stage of a logic circuit unit making up the scan driving circuit shown in FIG. 16.
Figure 19:
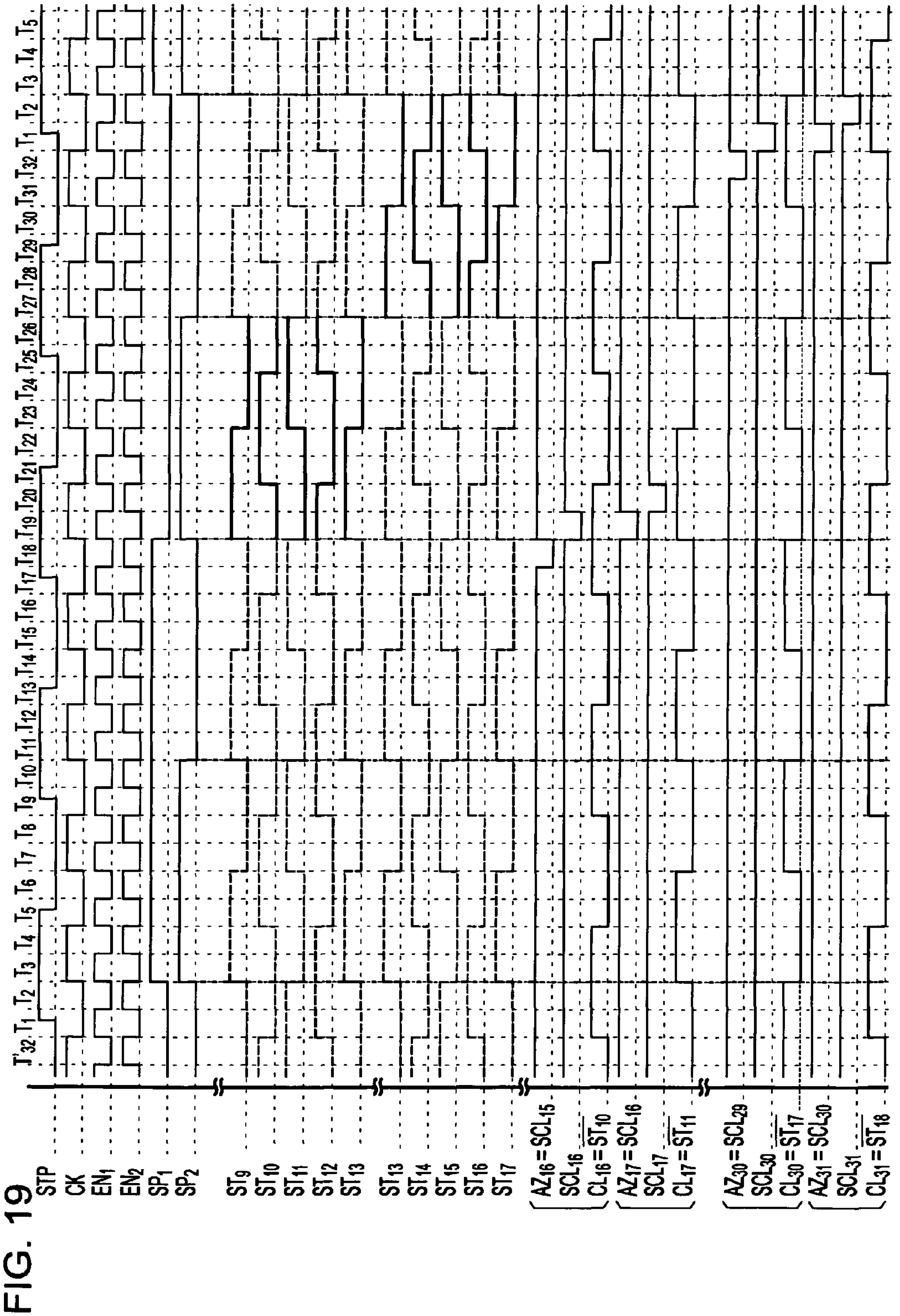
FIG. 19 is a schematic timing chart of a downstream stage of a logic circuit unit making up the scan driving circuit shown in FIG. 16.

FIG. 16 is a circuit diagram of a scan driving circuit according to a second embodiment, FIG. 17 is a schematic timing chart of a shift register unit making up the scan driving circuit shown in FIG. 16, FIG. 18 is a schematic timing chart of an upstream stage of a logic circuit unit 212 making up the scan driving circuit 210 shown in FIG. 16, and FIG. 19 is a schematic timing chart of a downstream stage of a logic circuit unit 212 making up the scan driving circuit 210 shown in FIG. 16.

With the scan driving circuit 110 according to the first embodiment, the first start pulse and second start pulse are input to the first stage shift register $SR_1$ in a period equivalent to one field period. With the scan driving circuit 210 according to the second embodiment, a third start pulse and fourth start pulse are also input in addition to these. Also, with the second embodiment, the period identifying signal is configured of a first period identifying signal $SP_1$ and a second period identifying signal $SP_2$. These are the primary points in which the second embodiment differs from the first embodiment. With the second embodiment, four periods are identified by combining the high/low level of the first period identifying signal $SP_1$ and second period identifying signal $SP_2$. Accordingly, with the second embodiment, the number of times of switching the display elements between lit/unlit states can be increased beyond that of the first embodiment.

As shown in FIG. 16, the scan driving circuit 210 also includes:

(A) a shift register unit 211 configured of P stages of shift registers SR, to sequentially shift input start pulses STP and output output signals ST from each stage; and (B) a logic circuit unit 212 configured to operate based on output signals ST from the shift register unit 211, and enable signals (as with the first embodiment, first enable signal $EN_1$ and second enable signal $EN_2$).

With the scan driving circuit 210, the configuration of the logic circuit unit 212 differs from that of the logic circuit unit 112 of the scan driving circuit 110 according to the first embodiment. The configuration of the shift register unit 211 of the scan driving circuit 210 is the same as that of the shift register unit 111 of the scan driving circuit 110.

As mentioned above, the first start pulse through fourth start pulse are input to the first stage shift register $SR_1$ within a period equivalent to one field period. Specifically, as shown in FIG. 17, the first start pulse input to the first stage shift register $SR_1$ is a pulse having a leading edge between the start and of the period $T_1$ and having a trailing edge between the start and of the period $T_5$. The second start pulse is a pulse having a leading edge between the start and of the period $T_9$ and having a trailing edge between the start and of the period $T_{13}$. The third start pulse is a pulse having a leading edge between the start and of the period $T_{17}$ and having a trailing edge between the start and of the period $T_{21}$. The fourth start pulse is a pulse having a leading edge between the start and of the period $T_{25}$ and having a trailing edge between the start and of the period $T_{29}$.

As with the case of the first embodiment, the clock signal CK is a square wave signal which inverts polarity every two horizontal scanning periods (2H). The first start pulse in the output signal $ST_1$ of the shift register $SR_1$ has the leading edge thereof at the start of the period $T_3$, and has the trailing edge at the end of period $T_6$. The first start pulse in the output signals $ST_2$, $ST_3$, and so on, for the shift register $SR_2$ and subsequent shift registers is a pulse which has been sequentially shifted by two horizontal scanning periods.

Also, the second start pulse in the output signal $ST_1$ of the shift register $SR_1$ has the leading edge thereof at the start of the period $T_{11}$, and has the trailing edge at the end of period $T_{14}$. The third start pulse in the output signal $ST_1$ of the shift register $SR_1$ has the leading edge thereof at the start of the period $T_{19}$, and has the trailing edge at the end of period $T_{22}$. The fourth start pulse in the output signal $ST_1$ of the shift register $SR_1$ has the leading edge thereof at the start of the period $T_{27}$, and has the trailing edge at the end of period $T_{30}$. The second through fourth pulses in the output signals $ST_2$, $ST_3$, and so on, for the shift register $SR_2$ and subsequent shift registers, are also pulses which have been sequentially shifted by two horizontal scanning periods.

Also, one each of a first enable signal through a Q'th enable signal exist in sequence between the start of the first start pulse of the output signal $ST_p$ and the start of the first start pulse of the output signal $ST_{p+1}$. In the second embodiment as well, Q=2, and there are one each of the first enable signal $EN_1$ and the second enable signal $EN_2$, in sequence. The first enable signal $EN_1$ and the second enable signal $EN_2$ have been described in the first embodiment, and accordingly description thereof will be omitted here.

As shown in FIG. 16, the logic circuit unit 212 has (P−2)×Q NAND circuits 213. Specifically, the logic circuit unit 212 has (1, 1)'th through (P−2, 2)'th NAND circuits 213. Period identifying signals SP for identifying each period from the start of the u'th start pulse start pulse in an output signal $ST_1$ to the start of a (u+1)'th start pulse, and a period from the start of the U'th start pulse to the start of the first start pulse in the next frame, are input to the logic circuit unit 212.

In the second embodiment, U=4, and the period identifying signal SP is a signal for identifying the period from the start of the first start pulse in the output signal $ST_1$ to the start of the second start pulse, the period from the start of the second start pulse to the start of the third start pulse, the period from the start of the third start pulse to the start of the fourth start pulse, and the period from the start of the fourth start pulse to the start of the first start pulse in the next frame. In the second embodiment, the period identifying signal SP is configured of the first period identifying signal $SP_1$ and the second period identifying signal $SP_2$.

The first period identifying signal $SP_1$ is a signal which is at high level during the period from the start of period $T_3$ to the end of period $T_{18}$, and at low level during the period from the start of period $T_{19}$ to the end of period $T_2$ of the next frame. That is to say, the first period identifying signal $SP_1$ is the same as the period identifying signal SP in the first embodiment. Conversely, the second period identifying signal $SP_2$ is a signal which is at high level during the period from the start of period $T_3$ to the end of period $T_{10}$, at low level during the period from the start of period $T_{11}$ to the end of period $T_{18}$, at high level during the period from the start of period $T_{19}$ to the end of period $T_{26}$, and at low level during the period from the start of period $T_{27}$ to the end of period $T_2$ of the next frame.

With a q'th enable signal represented as $EN_q$, as shown in FIG. 16 signals based on the period identifying signal SP (i.e., a signal based on the first period identifying signal $SP_1$ and a signal based on the second period identifying signal $SP_2$), the output signal $ST_p$, a signal obtained by inverting the output signal $ST_{p+1}$, and the q'th enable signal $EN_q$, are input to a (p', q)'th NAND circuit 213, whereby the operations of the NAND circuit 213 are restricted based on the first period identifying signal $SP_1$ and second period identifying signal $SP_2$, such that the NAND circuit 213 generates scanning signals based only on a portion of the output signal $ST_{p'}$ corresponding to the first start pulse, the signal obtained by inverting the output signal $ST_{p'+1}$, and the q'th enable signal $EN_q$.

The output signal $ST_{p'+1}$ is inverted by the NOR circuit 214 shown in FIG. 16, and input to the input side of the (p', q)'th NAND circuit 213. The output signal $ST_{p'}$ and the q'th enable signal $EN_q$ are directly input to the input side of the (p', q)'th NAND circuit 213.

With the second embodiment, the first period identifying signal $SP_1$ is directly input to the input side of the (1, 1)'th through (4, 2)'th NAND circuits 213, and the second period identifying signal $SP_2$ is also directly input. The first period identifying signal $SP_1$ is directly input to the input side of the (5, 1)'th through (8, 2)'th NAND circuits 213, and the second period identifying signal $SP_2$ inverted by a NOR circuit 216 shown in FIG. 16 is input.

Also, the first period identifying signal $SP_1$ is inverted by a NOR circuit 217 shown in FIG. 16 and input to the input side of the (9, 1)'th through (12, 2)'th NAND circuits 213, and the second period identifying signal $SP_2$ is directly input. The first period identifying signal $SP_1$ is inverted by the NOR circuit 217 and input to the input side of the (13, 1)'th through (16, 2)'th NAND circuits 213, and the second period identifying signal $SP_2$ is inverted by the NOR circuit 216 and is input.

Let us consider the (8, 1)'th NAND circuit 213. Signals based on the scanning signals from the (8, 1)'th NAND circuit 213 are supplied to the scanning line $SCL_{14}$. As shown in FIG. 16, in the period $T_{17}$ in which the scanning signal should be generated, the output signal $ST_8$, the signal obtained by inverting the output signal $ST_9$, and the first enable signal $EN_1$, are at high level. However, the first stage shift register $SR_1$ has also received input of the second start pulse through fourth start pulse in addition to the first start pulse, so the output signal $ST_8$, the signal obtained by inverting the output signal $ST_9$, and the first enable signal $EN_1$, are at high level in periods $T_1$, $T_9$, and $T_{25}$, as well.

Accordingly, if the (8, 1)'th NAND circuit 213 were to operate based only on the output signal $ST_8$, a signal obtained by inverting the output signal $ST_9$, and the first enable signal $EN_1$, trouble would occur in that a scanning signal would be supplied to the scanning line $SCL_{14}$ not only in the period $T_{17}$ in which the scanning signal should be generated, but also in the periods $T_1$, $T_9$, and $T_{25}$. However, as described above, the first period identifying signal $SP_1$ is directly input to the input side of the (8, 1)'th NAND circuit 213, and the second period identifying signal $SP_2$ is inverted and input. In periods $T_1$, $T_9$, $T_{17}$, and $T_{25}$, the only period where the first period identifying signal $SP_1$ is at a high level and the second period identifying signal $SP_2$ is at a low level is the period $T_{17}$. Accordingly, the (8, 1)'th NAND circuit 213 generates a scanning signal based only on the output signal $ST_8$, a signal obtained by inverting the output signal $ST_9$, and the first enable signal $EN_1$.

Let us also consider the (9, 1)'th NAND circuit 213. Signals based on the scanning signals from the (9, 1)'th NAND circuit 213 are supplied to the scanning line $SCL_{16}$ shown in FIG. 1. As shown in FIG. 19, in the period $T_{19}$ in which the scanning signal should be generated, the output signal $ST_9$, the signal obtained by inverting the output signal $ST_{10}$, and the first enable signal $EN_1$, are at high level. However, the first stage shift register $SR_1$ has also received input of the second start pulse through fourth start pulse in addition to the first start pulse, so the output signal $ST_9$, the signal obtained by inverting the output signal $ST_{10}$, and the first enable signal $EN_1$, are at high level in periods $T_3$, $T_{11}$, and $T_{27}$, as well.

Accordingly, if the (9, 1)'th NAND circuit 213 were to operate based only on the output signal $ST_9$, a signal obtained by inverting the output signal $ST_{10}$, and the first enable signal $EN_1$, trouble would occur in that a scanning signal would be supplied to the scanning line $SCL_{16}$ not only in the period $T_{19}$ in which the scanning signal should be generated, but also in the periods $T_3$, $T_{11}$, and $T_{27}$. However, as described above, the first period identifying signal $SP_1$ is inverted and input to the (9, 1)'th NAND circuit 213, and the second period identifying signal $SP_2$ is directly input. In periods $T_3$, $T_{11}$, $T_{19}$, and $T_{27}$, the only period where the first period identifying signal $SP_1$ is at a low level and the second period identifying signal $SP_2$ is at a high level is the period $T_{19}$. Accordingly, the (9, 1)'th NAND circuit 213 generates a scanning signal based only on the output signal $ST_9$, a signal obtained by inverting the output signal $ST_{10}$, and the first enable signal $EN_1$.

While description has been made regarding the operations of the (8, 1)'th NAND circuit 213 and the (9, 1)'th NAND circuit 213, the operations are the same for the other NAND circuits 213 as well. The (p', q)'th NAND circuit 213 generates a scanning signal based only on a portion of the output signal $ST_{p'}$ corresponding to the first start pulse, the signal obtained by inverting the output signal $ST_{p'+1}$, and the q'th enable signal $EN_q$.

Figure 20:
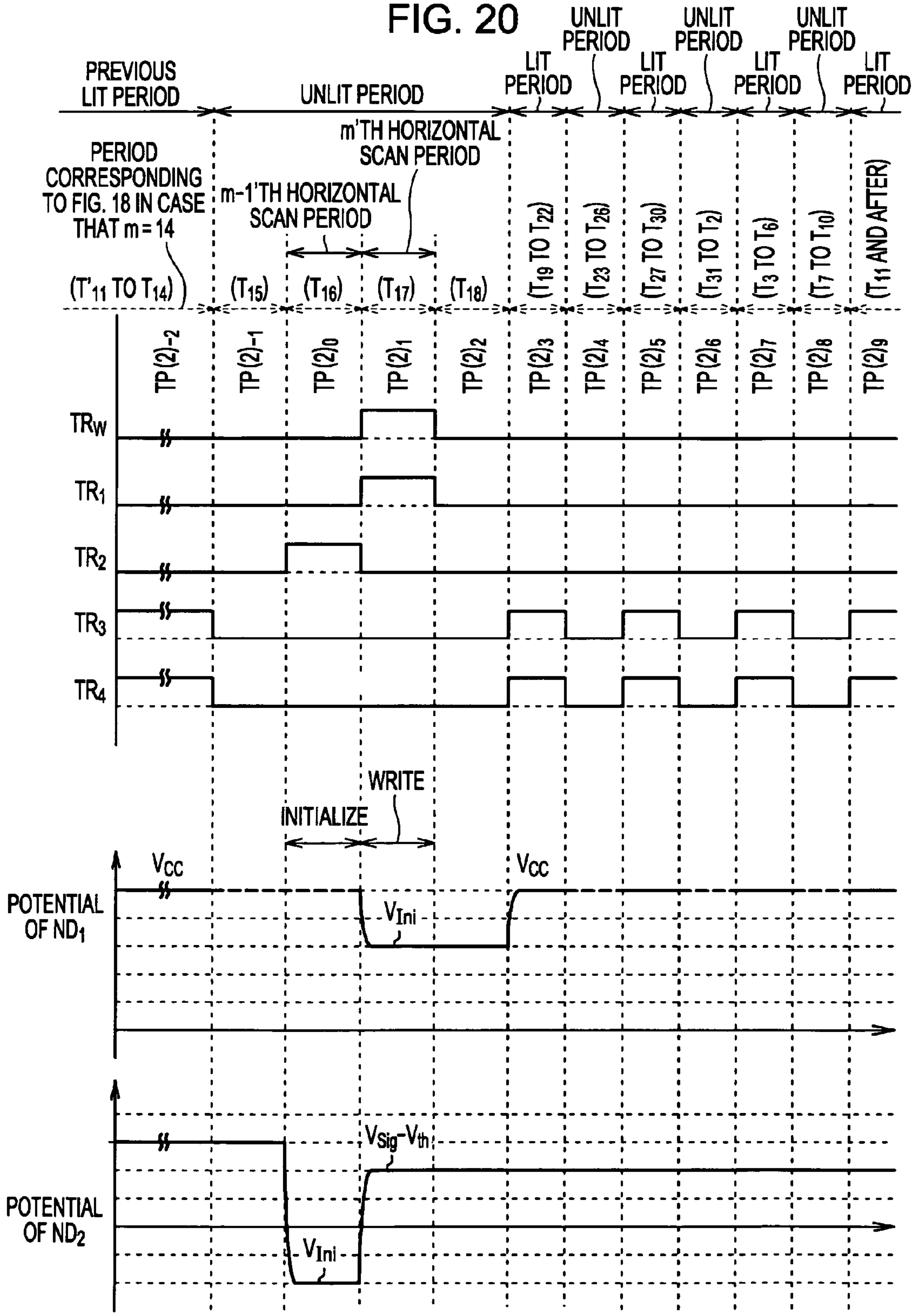
FIG. 20 is a circuit diagram of a driving circuit making up a display element at the m'th row and n'th column.

FIG. 20 is a schematic driving timing chart of the display element 10 at the m'th row and n'th column, corresponding to FIG. 8 in the first embodiment. In the same way as with the first embodiment, p'=8 and q=1, and m=14, when comparing the timing chart in FIG. 20 with FIGS. 17 through 19. Specifically, the timing chart of initialization control line $AZ_{14}$, scanning line $SCL_{14}$, and display control line $CL_{14}$ in FIG. 18 is to be referred to.

The operations of the Period $TP(\mathbf{2})_{-2}$ through Period $TP(\mathbf{2})_2$ shown in FIG. 20 are the same as the operations of the Period $TP(\mathbf{1})_{-2}$ through Period $TP(\mathbf{1})_2$ described with the first embodiment, so description thereof will be omitted. Also, Period $TP(\mathbf{2})_9$ shown in FIG. 20 corresponds to the Period $TP(\mathbf{1})_9$ described with the first embodiment, albeit there be different in the start thereof.

With the first embodiment, the lit period and unlit period switch once between the end of Period $TP(\mathbf{1})_2$ and the start Period $TP(\mathbf{1})_5$ in FIG. 8. On the other hand, with the second embodiment, the lit period and unlit period switch three times between the end of Period $TP(\mathbf{2})_2$ and the start Period $TP(\mathbf{2})_9$ in FIG. 20. Accordingly, flickering the image displayed on the display device is further reduced.

Third Embodiment

The third embodiment also relates to a scan driving circuit and to a display device having the scan driving circuit. As shown in FIG. 2, the display device 3 according to the third embodiment is of the same configuration as the display device 1 according to the first embodiment, other than the scan driving circuit being different. Accordingly, description of the display device 3 according to the third embodiment will be omitted.

Figure 21:
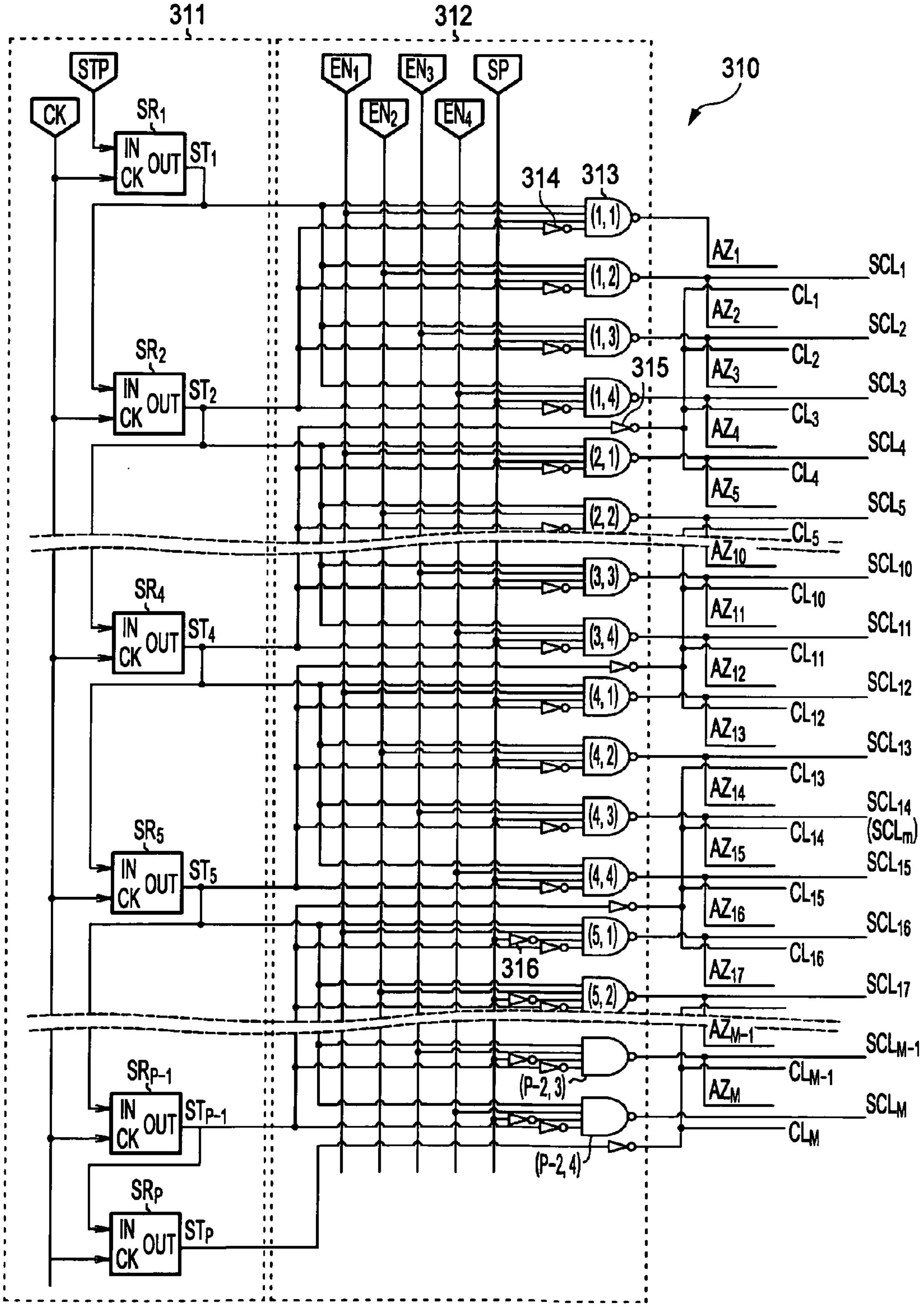
FIG. 21 is a circuit diagram of a scan driving circuit according to a third embodiment.
Figure 22:
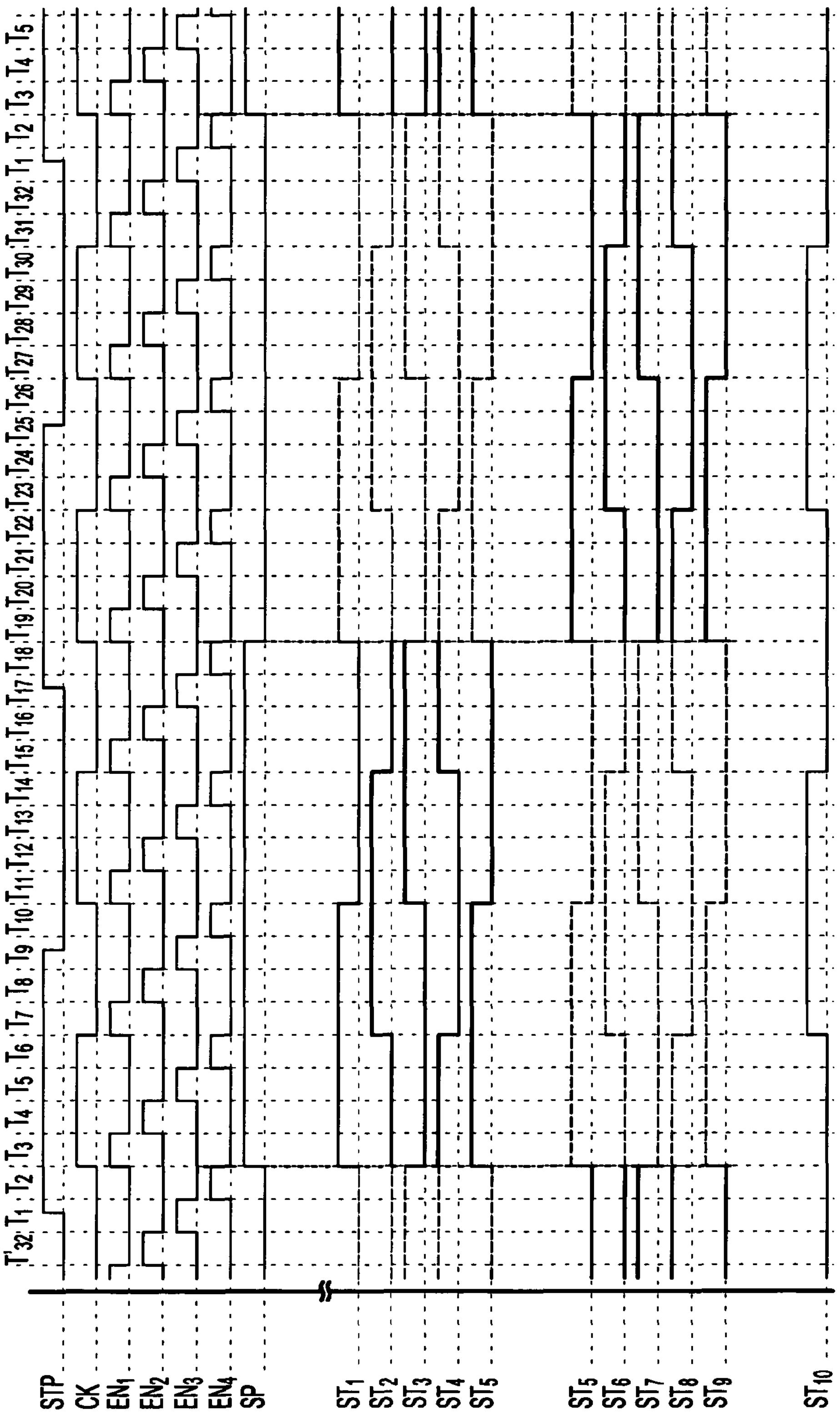
FIG. 22 is a schematic timing chart of a shift register unit making up the scan driving circuit shown in FIG. 21.
Figure 23:
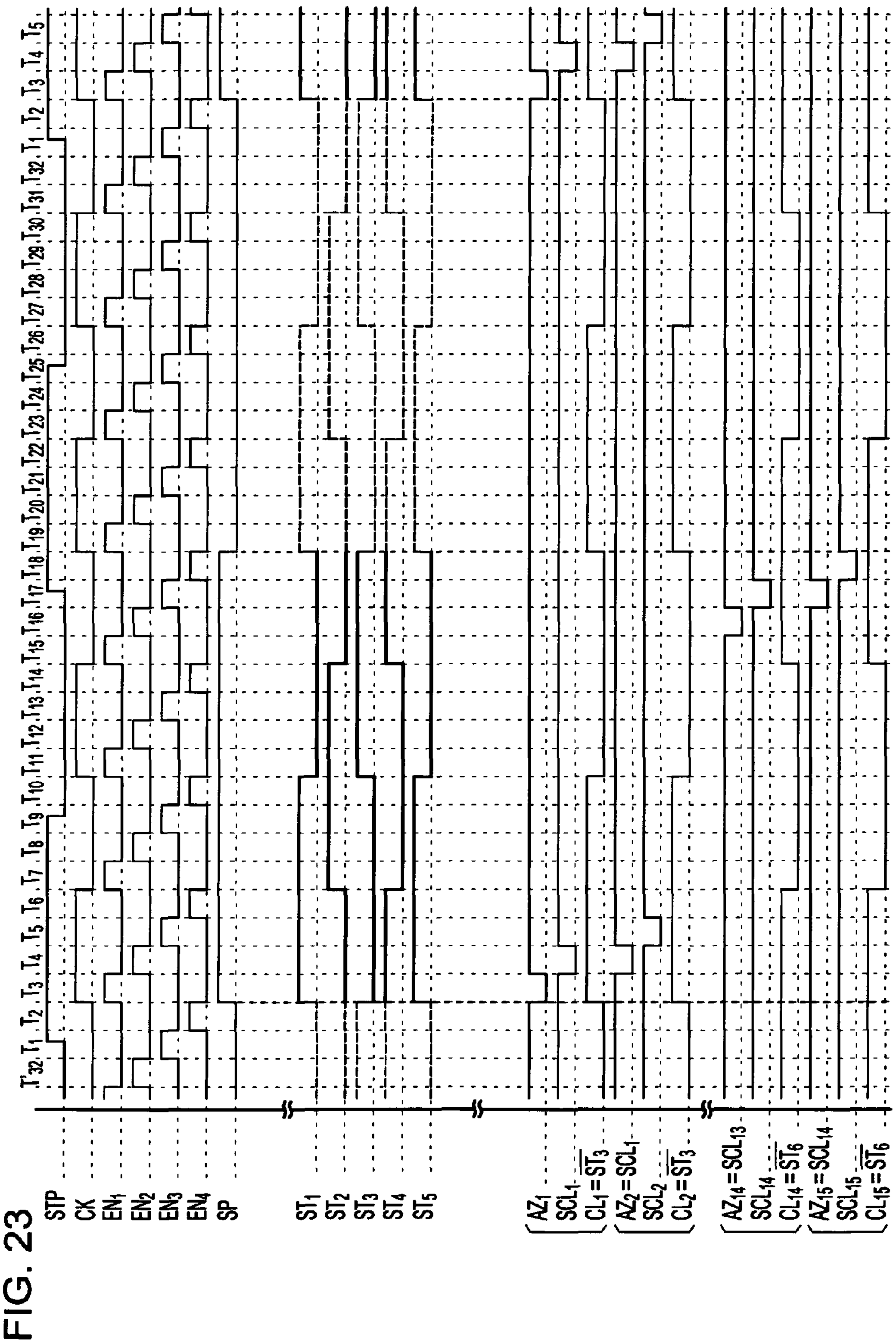
FIG. 23 is a schematic timing chart of an upstream stage of a logic circuit unit making up the scan driving circuit shown in FIG. 21.
Figure 24:
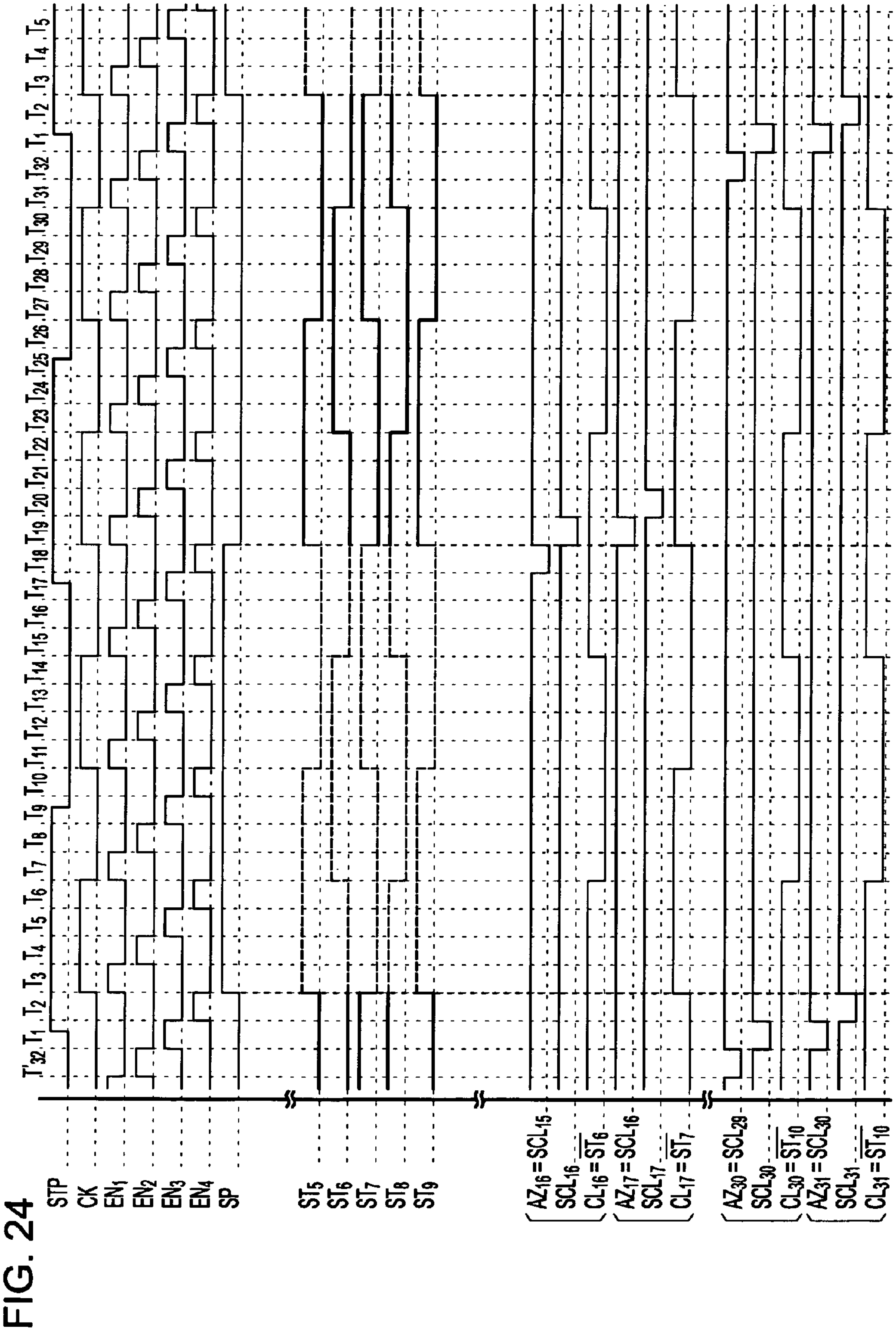
FIG. 24 is a schematic timing chart of a downstream stage of a logic circuit unit making up the scan driving circuit shown in FIG. 21.

FIG. 21 is a circuit diagram of a scan driving circuit 310 according to the third embodiment, FIG. 22 is a schematic timing chart of a shift register unit 311 making up the scan driving circuit 310 shown in FIG. 21, FIG. 23 is a schematic timing chart of an upstream stage of a logic circuit unit 312 making up the scan driving circuit 310 shown in FIG. 21, and FIG. 24 is a schematic timing chart of a downstream stage of the logic circuit unit 312 making up the scan driving circuit 310 shown in FIG. 21.

With the scan driving circuit 110 according to the first embodiment, a first enable signal $EN_1$ and second enable signal $EN_2$ are used. With the scan driving circuit 310 according to the third embodiment, a third enable signal $EN_3$ and fourth enable signal $EN_4$ are used in addition to these. Accordingly, the number of stages making up the shift register unit configuring the scan driving circuit can be reduced as compared with the case of the scan driving circuit 110 according to the first embodiment.

As shown in FIG. 21, the scan driving circuit 310 also includes:

(A) a shift register unit 311 configured of P stages of shift registers SR, to sequentially shift input start pulses STP and output output signals ST from each stage; and (B) a logic circuit unit 312 configured to operate based on output signals ST from the shift register unit 311, and enable signals (in the case of the third embodiment, first enable signal $EN_1$, second enable signal $EN_2$, third enable signal $EN_3$, and fourth enable signal $EN_4$).

Representing the output signals of the p'th stage shift register $SR_p$ with $ST_p$, the start of the start pulse in the output signal $ST_{p+1}$ of the p+1'th stage shift register $SR_{p+1}$ is situated between the start and end of the start pulse in the output signal $ST_p$, as shown in FIG. 22. The shift register unit 311 operates based on the clock signals CK and start pulse STP so as to satisfy the above conditions.

A first start pulse through a U'th start pulse are input to the first stage shift register $SR_1$ in a period equivalent to one field period. Note that with the third embodiment, U=2 the same as with the first embodiment, and the first start pulse and second start pulse are input.

Specifically, the first start pulse input to the first stage shift register $SR_1$ is a pulse which has a leading edge between the start and end of the period $T_1$ shown in FIG. 22, and which has a trailing edge between the start and end of the period $T_9$. Also, the second start pulse is a pulse which has a leading edge between the start and end of the period $T_{17}$ shown in FIG. 22, and which has a trailing edge between the start and end of the period $T_{25}$.

With the first and second embodiments, the clock signal CK is a square wave signal of which the polarity inverts every two horizontal scanning periods. Conversely, with the third embodiment, the clock signal CK is a square wave signal of which the polarity inverts every four horizontal scanning periods.

The first start pulse in the output signal $ST_1$ of the shift register $SR_1$ is a pulse which has the leading edge thereof at the start of the period $T_3$, and has the trailing edge at the end of period $T_{10}$. The first start pulses in the output signals $ST_2$, $ST_3$, and so on, for the shift register $SR_2$ and subsequent shift registers, are pulses which have been sequentially shifted by four horizontal scanning periods. The second start pulse in the output signal $ST_1$ of the shift register $SR_1$ is a pulse which has the leading edge thereof at the start of the period $T_{19}$, and has the trailing edge at the end of period $T_{26}$. The second start pulses in the output signals $ST_2$, $ST_3$, and so on, for the shift register $SR_2$ and subsequent shift registers, are pulses which have been sequentially shifted by four horizontal scanning periods.

Also, one each of a first enable signal through a Q'th enable signal exist in sequence between the start of the first start pulse of the output signal $ST_p$ and the start of the first start pulse of the output signal $ST_{p+1}$. In the third embodiment, Q=4, and there are one each of the first enable signal $EN_1$, second enable signal $EN_2$, third enable signal $EN_3$, and fourth enable signal $EN_4$ in sequence. In other words, the first enable signal $EN_1$, second enable signal $EN_2$, third enable signal $EN_3$, and fourth enable signal $EN_4$ are signals generated so as to satisfy the above conditions, and basically are square wave signals of the same cycle but with different phases.

Specifically, the first enable signal $EN_1$ is a square wave signal of which one cycle is four horizontal scanning periods. The second enable signal $EN_2$ is a signal of which the phase is delayed as to the first enable signal $EN_1$ by one horizontal scanning period. The third enable signal $EN_3$ is a signal of which the phase is delayed as to the first enable signal $EN_1$ by two horizontal scanning periods. The fourth enable signal $EN_4$ is a signal of which the phase is delayed as to the first enable signal $EN_1$ by three horizontal scanning periods.

For example, one each of the first enable signal $EN_1$ in the period $T_3$, the second enable signal $EN_2$ in the period $T_4$, the third enable signal $EN_3$ in the period $T_5$, and the fourth enable signal $EN_4$ in the period $T_6$, sequentially exist between the start of the start pulse in the output signal $ST_1$ (i.e., start of period $T_3$) and the start of the start pulse in the output signal $ST_2$ (i.e., start of period $T_7$). In the same way, one each of the first enable signal $EN_1$, second enable signal $EN_2$, third enable signal $EN_3$, and fourth enable signal $EN_4$, serially exist between the start of the start pulse in the output signal $ST_2$ and the start of the start pulse in the output signal $ST_3$.

As shown in FIG. 21, the logic circuit unit 312 has (P−2)×Q NAND circuits 313. Specifically, the logic circuit unit 312 has (1, 1)'th through (P−2, 4)'th NAND circuits 313. Period identifying signals SP for identifying each period from the start of the u'th start pulse start pulse in an output signal $ST_1$ to the start of a (u+1)'th start pulse, and a period from the start of the U'th start pulse to the start of the first start pulse in the next frame, are input to the logic circuit unit 312.

In the third embodiment, U=2, and the period identifying signal SP is as described with the first embodiment. That is to say, the period identifying signal SP is a signal for identifying the period from the start of the first start pulse in the output signal $ST_1$ to the start of the second start pulse, and the period from the start of the second start pulse to the start of the first start pulse in the next frame. In the third embodiment as well, the period identifying signal SP is a signal which is at high level during the period from the start of period $T_3$ to the end of period $T_{18}$, and at low level during the period from the start of period $T_{19}$ to the end of period $T_2$ of the next frame.

With a q'th enable signal represented as $EN_q$, as shown in FIG. 21 signals based on the period identifying signal SP, the output signal $ST_p$, a signal obtained by inverting the output signal $ST_{p+1}$, and the q'th enable signal $EN_q$, are input to a (p', q)'th NAND circuit 313, whereby the operations of the NAND circuit 313 are restricted based on the period identifying signal SP, such that the NAND circuit 313 generates scanning signals based only on a portion of the output signal $ST_{p'}$ corresponding to the first start pulse, the signal obtained by inverting the output signal $ST_{p'+1}$, and the q'th enable signal $EN_q$.

The output signal $ST_{p'+1}$ is inverted by the NOR circuit 314 shown in FIG. 21, and input to the input side of the (p', q)'th NAND circuit 313. The output signal $ST_{p'}$ and the q'th enable signal $EN_q$ are directly input to the input side of the (p', q)'th NAND circuit 313.

With the third embodiment, as with the first embodiment, the period identifying signal SP is directly input to the input side of the (1, 1)'th through (4, 4)'th NAND circuits 313. The period identifying signal SP is inverted by the. NOR circuit 316 and input to the input side of the (5, 1)'th through (8, 4)'th NAND circuits 313.

Let us consider the (4, 3)'th NAND circuit 313, for example. Signals based on the scanning signals from the (4, 3)'th NAND circuit 313 are supplied to the scanning line $SCL_{14}$ shown in FIG. 21. As shown in FIG. 23, in the period $T_{17}$ in which the scanning signal should be generated, the output signal $ST_4$, the signal obtained by inverting the output signal $ST_5$, and the third enable signal $EN_3$, are at high level. However, the first stage shift register $SR_1$ has also received input of the second start pulse in addition to the first start pulse, so the output signal $ST_4$, the signal obtained by inverting the output signal $ST_5$, and the third enable signal $EN_3$, are at high level in period $T_1$ as well.

Accordingly, if the (4, 3)'th NAND circuit 313 were to operate based only on the output signal $ST_4$, a signal obtained by inverting the output signal $ST_5$, and the third enable signal $EN_3$, trouble would occur in that a scanning signal would be supplied to the scanning line $SCL_{14}$ not only in the period $T_{17}$ in which the scanning signal should be generated, but also in the period $T_1$. However, as described above, the period identifying signal SP is directly input to the input side of the (4, 3)'th NAND circuit 313. Of periods $T_1$ and $T_{17}$, the only period where the period identifying signal SP is at a high level is the period $T_{17}$. Accordingly, the (4, 3)'th NAND circuit 313 generates a scanning signal based only on the output signal $ST_4$, a signal obtained by inverting the output signal $ST_5$, and the third enable signal $EN_3$.

Let us also consider the (5, 1)'th NAND circuit 313. Signals based on the scanning signals from the (5, 1)'th NAND circuit 313 are supplied to the scanning line $SCL_{16}$ shown in FIG. 21. As shown in FIG. 24, in the period $T_{19}$ in which the scanning signal should be generated, the output signal $ST_5$, the signal obtained by inverting the output signal $ST_6$, and the first enable signal $EN_1$, are at high level. However, the first stage shift register $SR_1$ has also received input of the second start pulse in addition to the first start pulse, so the output signal $ST_5$, the signal obtained by inverting the output signal $ST_6$, and the first enable signal $EN_1$, are at high level in period $T_3$ as well.

Accordingly, if the (5, 1)'th NAND circuit 313 were to operate based only on the output signal $ST_5$, a signal obtained by inverting the output signal $ST_6$, and the first enable signal $EN_1$, trouble would occur in that a scanning signal would be supplied to the scanning line $SCL_{16}$ not only in the period $T_{19}$ in which the scanning signal should be generated, but also in the period $T_3$. However, as described above, the period identifying signal SP is inverted and input to the (5, 1)'th NAND circuit 313. Of periods $T_3$ and $T_{19}$, the only period where the period identifying signal SP is at a low level is the period $T_{19}$. Accordingly, the (5, 1)'th NAND circuit 313 generates a scanning signal based only on the output signal $ST_5$, a signal obtained by inverting the output signal $ST_6$, and the first enable signal $EN_1$.

While description has been made regarding the operations of the (4, 3)'th NAND circuit 313 and the (5, 1)'th NAND circuit 313, the operations are the same for the other NAND circuits 313 as well. The (p', q)'th NAND circuit 313 generates a scanning signal based only on a portion of the output signal $ST_p$ corresponding to the first start pulse in the output signal $ST_p$, the signal obtained by inverting the output signal $ST_{p'+1}$, and the q'th enable signal $EN_q$.

Figure 25:
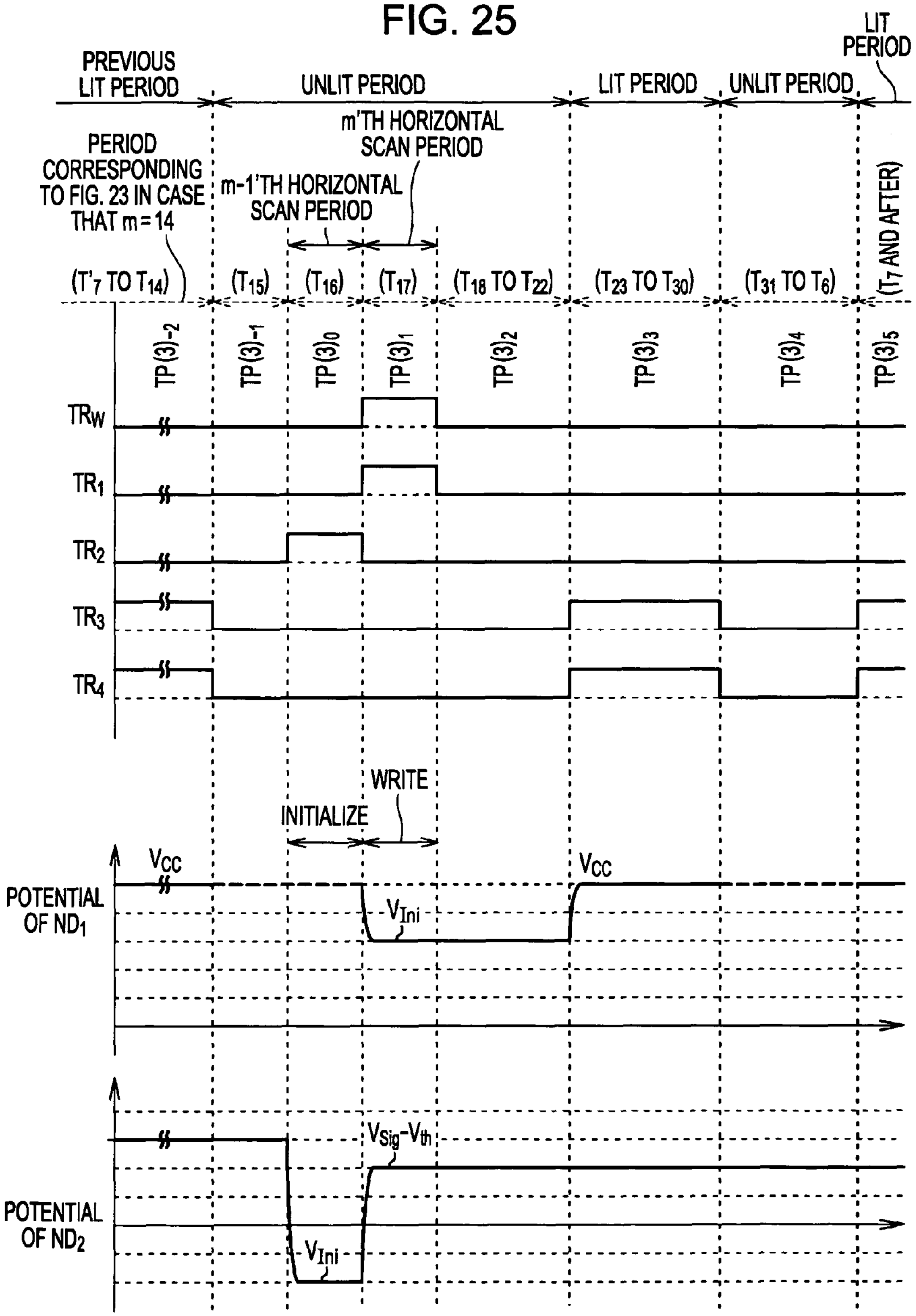
FIG. 25 is a circuit diagram of a driving circuit making up a display element at the m'th row and n'th column.
Figure 26:
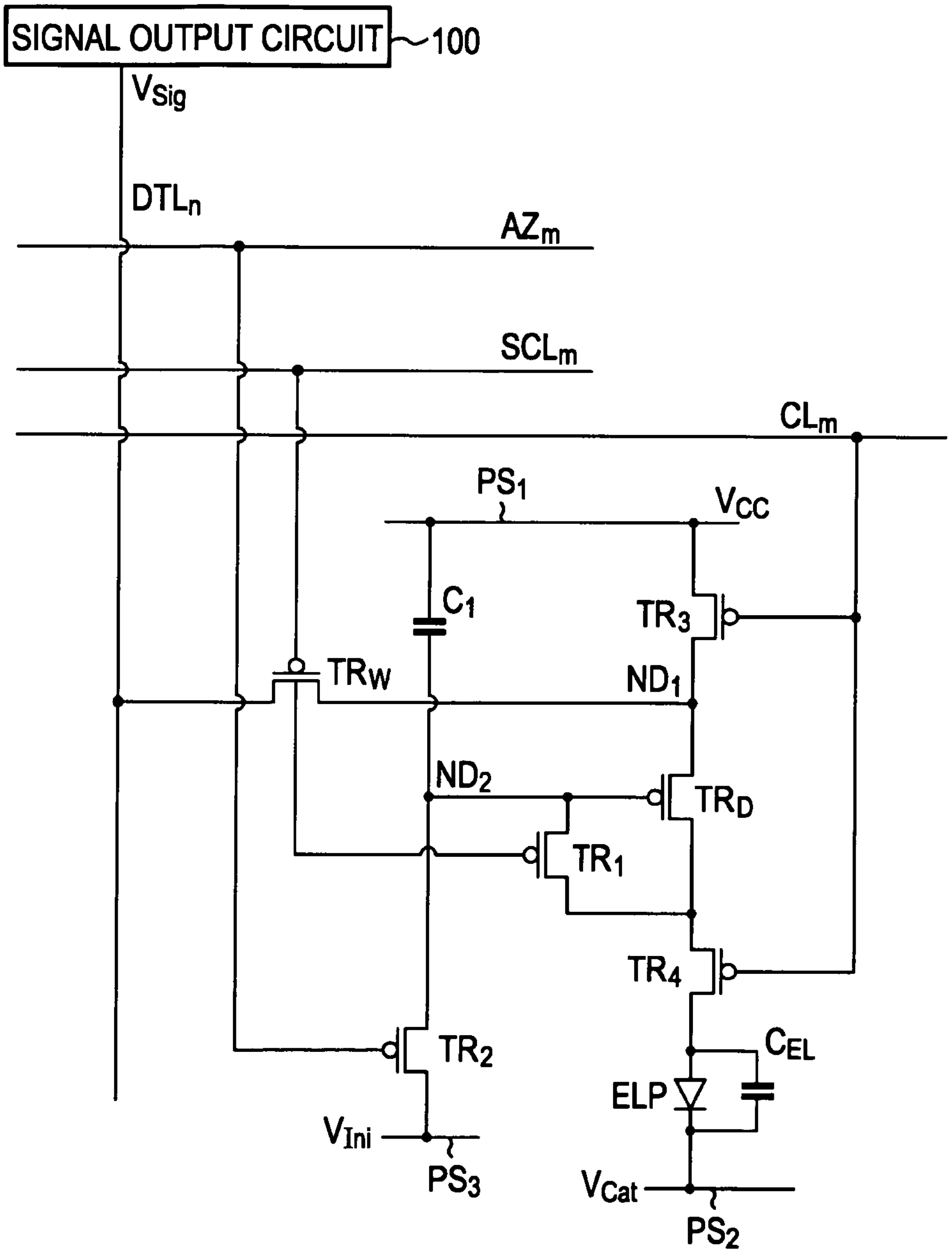
FIG. 26 is an equivalent circuit diagram of a driving circuit making up a display element at the m'th row and n'th column in a display device where display elements are arrayed in two-dimensional matrix fashion.
Figure 27A:
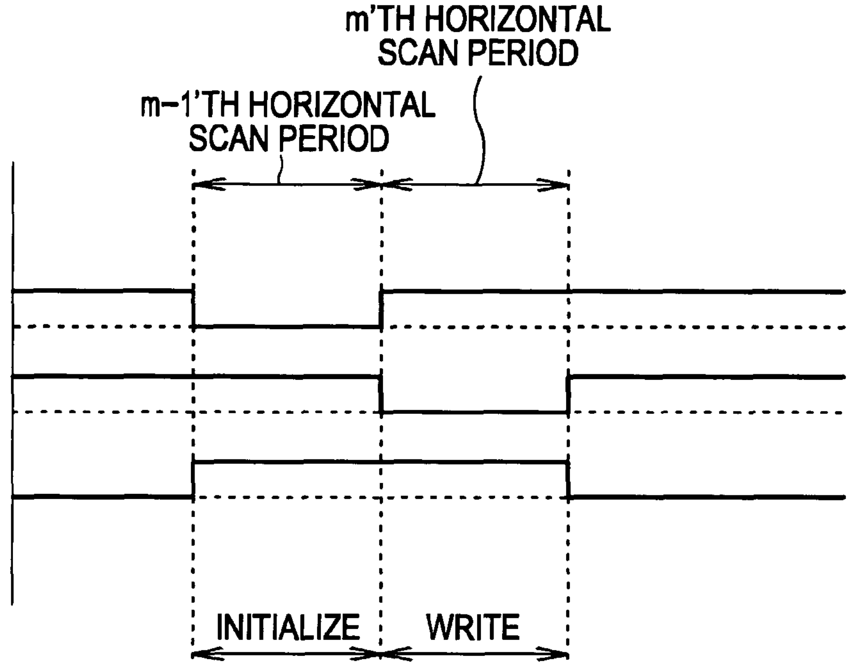
FIG. 27A is a schematic timing chart of signals on an initialization control line, scanning line, and display control line.
Figure 27B:
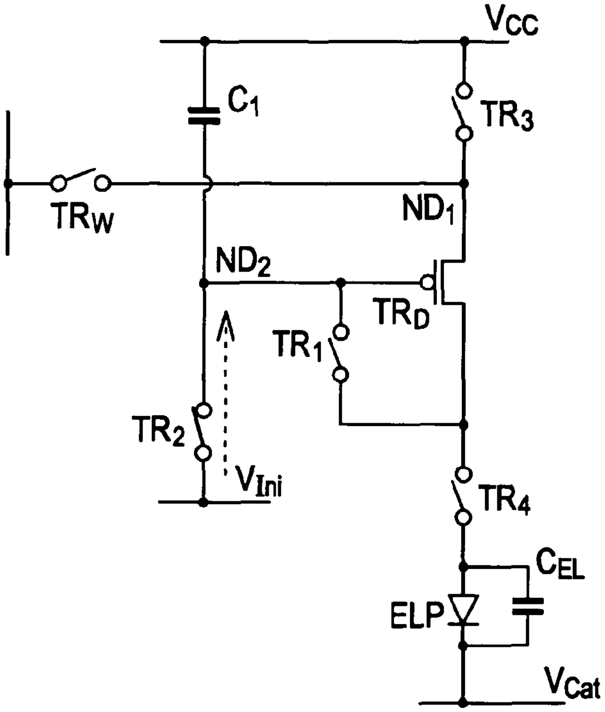
FIG. 27B is a schematic diagram illustrating the on/off states of the transistors of the driving circuit.
Figure 28A:
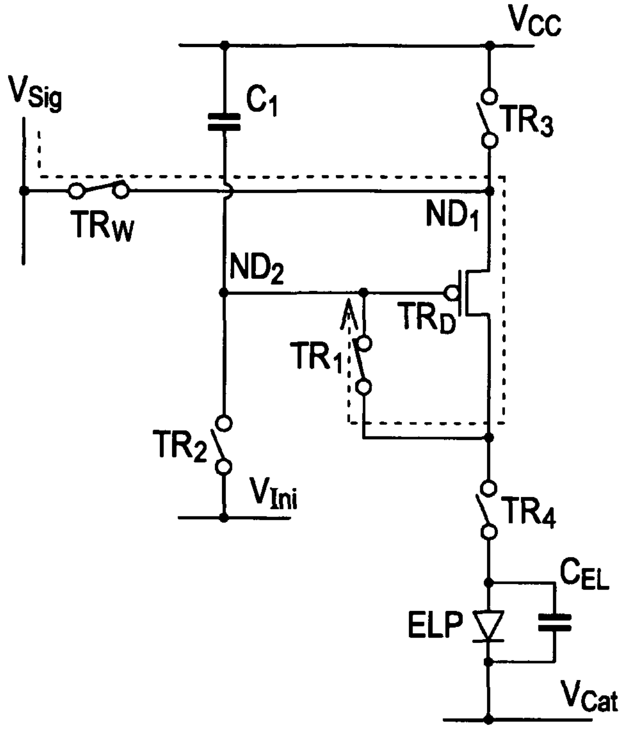
FIGS. 28A and 28B are diagrams continuing from FIG. 27B, schematically illustrating the on/off states of the transistors in the driving circuit.
Figure 28B:
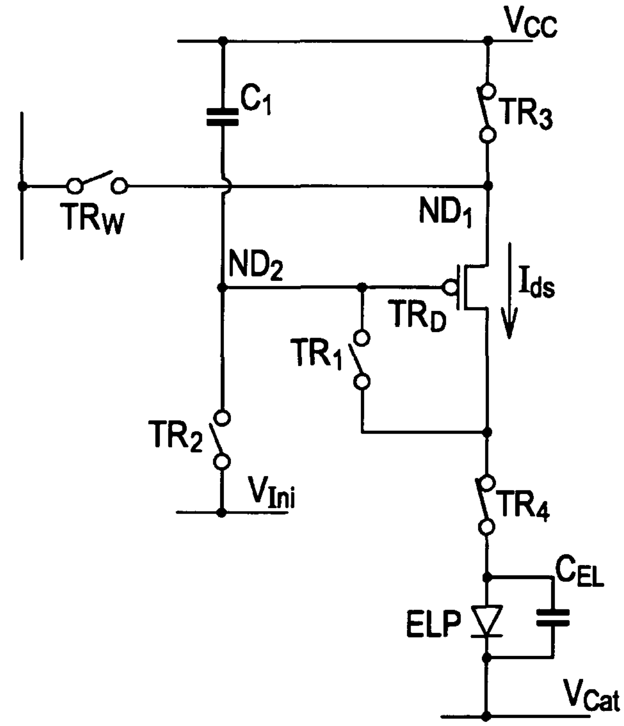

FIG. 25 is a schematic driving timing chart of the display element 10 at the m'th row and n'th column, corresponding to FIG. 8 in the first embodiment. Here, p'=4 and q=3, and in the same way as with the first embodiment, m=14, when comparing the timing chart in FIG. 25 with FIGS. 22 through 24. Specifically, the timing chart of initialization control line $AZ_{14}$, scanning line $SCL_{14}$, and display control line $CL_{14}$ in FIG. 23 is to be referred to.

The operations of the Period TP(3)$_{-2}$ through Period TP(3)$_2$ shown in FIG. 25 are the same as the operations of the Period TP(1)$_{-2}$ through Period TP(1)$_2$ described with the first embodiment, so description thereof will be omitted. Also, the operations of Period TP(3)$_3$ through Period TP(3)$_5$ shown in FIG. 25 are the same as the operations of Period TP(1)$_3$ through Period TP(1)$_5$ described with the first embodiment, albeit there be different in the length of periods thereof, so description thereof will be omitted.

While the present invention has been described so far with reference to preferred embodiments, the present invention is not restricted by these embodiments. The configuration and structure of the various components configuring the scan driving circuit, display device, and display elements, and the processes in the operations of the display device, described in the embodiments, may be modified as appropriate.

For example, with the driving circuit 11 configuring the display element 10 shown in FIG. 6, in the event that the third transistor $TR_3$ and fourth transistor $TR_4$ are n-channel type transistors, the NOR circuit 115 shown in FIG. 1, the NOR circuit 215 shown in FIG. 16, and the NOR circuit 315 shown in FIG. 21, can be omitted. In this way, the polarity of signals from the scan driving circuit can be suitably set in accordance with the configuration of the display elements, and supplied to the scanning lines, initialization control lines, and display control lines.

The present application contains subject matter related to that disclosed in Japanese Priority Patent Application JP 2008-182369 filed in the Japan Patent Office on Jul. 14, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:

(1) display elements arrayed in the form of a two-dimensional matrix;

(2) scanning lines, initialization control lines configured to initialize said display elements, and display control lines configured to control lit/unlit states of said display elements, said scanning lines, initialization control lines, and display control lines extending in a first direction;

(3) data lines extending in a second direction different from said first direction; and (4) a scan driving circuit;

said scan driving circuit including (A) a shift register unit configured of P (wherein P is a natural number of 3 or greater) stages of shift registers, to sequentially shift input start pulses and output output signals from each stage, and (B) a logic circuit unit configured to operate based on output signals from said shift register unit, and enable signals, (C) where, with the output signals of a p'th (where p=1, 2, . . . P−1) stage shift register represented as $ST_p$, the start of a start pulse of an output signal $ST_{p+1}$ of a p+1'th shift register is situated between the start and end of a start pulse of the output signal $ST_p$, (D) and where one each of a first enable signal through a Q'th enable signal (where Q is a natural number of 2 or greater) exist in sequence between the start of the start pulse of the output signal $ST_p$ and the start of the start pulse of the output signal $ST_{p+1}$, (E) and wherein said logic circuit unit includes (P−2)×Q NAND circuits;

wherein a first start pulse through a U'th (where U is a natural number of 2 or greater) start pulse are input to a first stage shift register during a period equivalent to one field period;

and wherein period identifying signals are input to said logic circuit unit to identify each period from a u'th (where u=1, 2, . . . U−1) start pulse in an output signal $ST_1$ to a u+1'th start pulse, and a period from the start of the U'th start pulse to the start of the first start pulse in the next frame;

and wherein, with a q'th enable signal (where q=1, 2, . . . Q−1) represented as $EN_q$, a signal based on a period identifying signal, the output signal $ST_p$, a signal obtained by inverting the output signal $ST_{p+1}$, and the q'th enable signal $EN_q$, are input to a (p', q)'th NAND circuit;

and wherein the operations of said NAND circuit are restricted based on period identifying signals, such that said NAND circuit generates scanning signals based only on a portion of the output signal $ST_p$ corresponding to the first start pulse, the signal obtained by inverting the output signal $ST_{p+1}$, and the q'th enable signal $EN_q$, and wherein, with regard to a display element receiving supply of signals based on scanning signals from the (p', q)'th NAND circuit (except for a case wherein (p'=1, q=1) via a scanning line, a signal based on a scanning signal from a (p'−1, q')'th (wherein q is a natural number from 1 through Q) NAND circuit, in the event that q=1 holds, and a signal based on a scanning signal from a (p', q")'th (wherein q" is a natural number from 1 through (q−1)) NAND circuit, in the event that q>1 holds, are supplied from an initialization control line connected to said display element, and a signal based on the output signal $ST_{p+1}$ from a p'+1'th shift register, in the event that q=1 holds, and a signal based on an output signal $ST_{p+2}$ from a p'+2'th shift register, in the event that q>1 holds, are supplied from a display control line connected to said display element.

2. The display device according to claim 1, wherein, with regard to a display element receiving supply of signals based on scanning signals from the (p', q)'th NAND circuit via a scanning line, a signal based on a scanning signal from a (p'−1, Q')'th NAND circuit, in the event that q=1 holds, and a signal based on a scanning signal from a (p', q−1)'th NAND circuit, in the event that q>1 holds, are supplied from an initialization control line connected to said display element.

3. The display device according to claim 1, each of said display elements comprising:

(1-1) a driving circuit including a write transistor, a driving transistor, and a capacitance unit; and (1-2) a light emitting unit to which current is applied via said driving transistor.

4. The display device according to claim 3, wherein said light-emitting unit is configured of an organic electroluminescence unit.

5. The display device according to claim 3, wherein, with regard to said write transistor, (a-1) one source/drain region is connected to the data line, and (a-2) the gate electrode is connected to the scanning line;

and wherein, with regard to said driving transistor, (b-1) one source/drain region is connected to the other source/drain region of said write transistor, thereby configuring a first node;

and wherein, with regard to said capacitance unit, (c-1) a predetermined reference voltage is applied to one end thereof, and (c-2) the other end is connected with the gate electrode of the driving transistor, thereby configuring a second node;

and wherein said write transistor is controlled by signals from the scanning line.

6. The display device according to claim 5, said driving circuit further comprising:

(d) a first switch circuit unit connected between said second node and the other source/drain region of said driving transistor;

wherein said first switch circuit unit is controlled by signals from the scanning line.

7. The display device according to claim 5, said driving circuit further comprising:

(e) a second switch circuit unit connected between said second node and a power supply line to which a predetermined initialization voltage is applied;

wherein said second switch circuit unit is controlled by signals from the initialization control line.

8. The display device according to claim 5, said driving circuit further comprising:

(f) a third switch circuit unit connected between said first node and a power supply line to which a driving voltage is applied;

wherein said third switch circuit unit is controlled by signals from the display control line.

9. The display device according to claim 5, said driving circuit further comprising:

(g) a fourth switch circuit unit connected between the other source/drain region of said driving transistor and one end of said light emitting unit;

wherein said fourth switch circuit unit is controlled by signals from the display control line.

10. A driving circuit comprising:

(A) a shift register unit configured of P (wherein P is a natural number of 3 or greater) stages of shift registers, to sequentially shift input start pulses and output output signals from each stage, and (B) a logic circuit unit configured to operate based on output signals from said shift register unit, and enable signals, (C) where, with the output signals of a p'th (where p=1, 2, . . . P−1) stage shift register represented as $ST_p$, the start of a start pulse of an output signal $ST_{p+1}$ of a p+1'th shift register is situated between the start and end of a start pulse of the output signal $ST_p$, (D) and where one each of a first enable signal through a Q'th enable signal (where Q is a natural number of 2 or greater) exist in sequence between the start of the start pulse of the output signal $ST_p$ and the start of the start pulse of the output signal $ST_{p+1}$, (E) and wherein said logic circuit unit includes (P−2)×Q NAND circuits;

wherein a first start pulse through a U'th (where U is a natural number of 2 or greater) start pulse are input to a first stage shift register during a period equivalent to one field period;

and wherein period identifying signals are input to said logic circuit unit to identify each period from a u'th (where u=1, 2, . . . U−1) start pulse in an output signal $ST_1$ to a u+1'th start pulse, and a period from the start of the U'th start pulse to the start of the first start pulse in the next frame;

and wherein, with a q'th enable signal (where q=1, 2, . . . Q−1) represented as $EN_q$, a signal based on a period identifying signal, the output signal $ST_p$, a signal obtained by inverting the output signal $ST_{p+1}$, and the q'th enable signal $EN_q$, are input to a (p', q)'th NAND circuit;

and wherein the operations of said NAND circuit are restricted based on period identifying signals, such that said NAND circuit generates scanning signals based only on a portion of the output signal $ST_p$ corresponding to the first start pulse, the signal obtained by inverting the output signal $ST_{p+1}$, and the q'th enable signal $EN_q$.

* * * * *